(12) United States Patent
Verdant et al.

(10) Patent No.: US 10,116,324 B2
(45) Date of Patent: Oct. 30, 2018

(54) HIGH-LINEARITY SIGMA-DELTA CONVERTER

(71) Applicants: COMMISSARIAT A L'ENERGIE ATOMIQUE ET AUX ENERGIES ALTERNATIVES, Paris (FR); TRIXELL, Moirans (FR)

(72) Inventors: Arnaud Verdant, Saint Nazaire les Eymes (FR); Marc Arques, Grenoble (FR); William Guicquero, Bures sur Yvette (FR)

(73) Assignees: COMMISSARIAT A L'ENERGIE ATOMIQUE ET AUX ENERGIES ALTERNATIVES, Paris (FR); TRIXELL, Moirans (FR)

( * ) Notice: Subject to any disclaimer, the term of this patent is extended or adjusted under 35 U.S.C. 154(b) by 0 days.

(21) Appl. No.: 15/551,878

(22) PCT Filed: Feb. 22, 2016

(86) PCT No.: PCT/EP2016/053687
§ 371 (c)(1),
(2) Date: Aug. 17, 2017

(87) PCT Pub. No.: WO2016/131990
PCT Pub. Date: Aug. 25, 2016

(65) Prior Publication Data
US 2018/0069567 A1    Mar. 8, 2018

(30) Foreign Application Priority Data

Feb. 20, 2015    (FR) ...................................... 15 51478
Sep. 24, 2015    (FR) ...................................... 15 58987

(51) Int. Cl.
*H03M 3/00* (2006.01)

(52) U.S. Cl.
CPC .................................. *H03M 3/496* (2013.01)

(58) Field of Classification Search
CPC ..................................................... H03M 3/496
(Continued)

(56) References Cited

U.S. PATENT DOCUMENTS 6,452,524 B1 * 9/2002 Fraleigh .............. H03M 7/3015
341/143
7,053,807 B1    5/2006 Gaalaas
(Continued)

FOREIGN PATENT DOCUMENTS

DE    197 25 171 A1    12/1998

OTHER PUBLICATIONS

Zourntos et al., "Stable One-Bit Delta-Sigma Modulators Based on Switching Control," Proceedings of the 1998 IEEE International Conference on Acoustics, Speech and Signal Processing, vol. CONF. 23, May 12, 1998, pp. 1597-1600, XP000948407.
(Continued)

*Primary Examiner* — Lam T Mai
(74) *Attorney, Agent, or Firm* — Baker Hostetler LLP

(57) ABSTRACT

A sigma-delta converter comprises a sigma-delta modulator suitable for supplying a series of binary samples (BS(k)) representative of an analogue input signal (Vin) to be digitized, in which at least one analogue signal internal to the modulator is weighted by a coefficient that is variable according to a first predetermined law (f).

28 Claims, 8 Drawing Sheets

(58) Field of Classification Search
USPC .......................................................... 341/143
See application file for complete search history.

(56) References Cited

U.S. PATENT DOCUMENTS

| | | | | |
|---|---|---|---|---|
| 7,173,485 | B2 * | 2/2007 | Nagai | ................. H03F 3/45197 330/107 |
| 8,405,535 | B1 | 3/2013 | Xiao et al. | |
| 2008/0074303 | A1 * | 3/2008 | Rueger | ................... H03M 3/39 341/143 |
| 2008/0100486 | A1 * | 5/2008 | Lin | ....................... H03M 3/352 341/143 |
| 2012/0194370 | A1 * | 8/2012 | Rangan | ................ H03M 3/428 341/143 |
| 2014/0035769 | A1 * | 2/2014 | Rajaee | ................. H03M 3/452 341/143 |
| 2014/0113575 | A1 * | 4/2014 | Mitani | .................... H03M 3/44 455/78 |
| 2015/0171888 | A1 * | 6/2015 | Breems | ................. H03M 3/368 341/143 |
| 2018/0034421 | A1 * | 2/2018 | Abdo | .................... H03F 1/301 |

OTHER PUBLICATIONS

Maghari et al., "Sturdy MASH Δ-Σ modulator," Electronics Letters, vol. 42, No. 22, Oct. 26, 2006.
Libin Yao et al., "A High-Linearity Sigma-Delta Topology Suitable for Low-Voltage Applications," Jan. 1, 2000, XP055239216.

* cited by examiner

HIGH-LINEARITY SIGMA-DELTA CONVERTER

CROSS-REFERENCE TO RELATED APPLICATIONS

This application is a National Stage of International patent application PCT/EP2016/053687, filed on Feb. 22, 2016, which claims priority to foreign French patent application Nos. FR 1551478, filed on Feb. 20, 2015 and FR 1558987, filed Sep. 24, 2015, the disclosures of which are incorporated by reference in their entirety.

FIELD OF THE INVENTION

The present invention relates to the field of analogue-digital converters, and, more particularly, sigma-delta converters.

BACKGROUND

A sigma-delta converter typically comprises a sigma-delta modulator and a digital filter. The analogue signal to be digitized is applied as input to the modulator, and is sampled thereby at a relatively high frequency (in relation to the maximum frequency of the input signal), called oversampling frequency. The modulator produces, at the oversampling frequency, binary samples representative of the analogue input signal. The output bit stream from the sigma-delta modulator is processed by the digital filter which extracts from it an N-bit digital value (N being the quantization resolution of the sigma-delta converter), representative of the input signal. The number of binary samples (that is to say the number of oversampling periods) necessary to produce an N-bit digital output value is designated by the acronym OSR, from the acronym "Over Sampling Ratio".

The sigma-delta modulator typically consists of a loop comprising at least an analogue integration circuit, a 1-bit analogue-digital converter, a 1-bit digital-analogue converter, and a subtractor. The analogue input signal is applied to the input of the integration circuit, which samples it at the oversampling frequency and supplies, at this same frequency, analogue samples representative of the difference between the input signal and an analogue feedback signal. The analogue output samples from the integration circuit are digitized by the 1-bit analogue-digital converter (typically a comparator). The binary samples thus obtained from the output signal of the modulator. These binary samples are elsewhere converted into analogue samples by the 1-bit digital-analogue converter, the analogue signal thus obtained forming the feedback signal of the modulator. The analogue integration circuit can comprise a single analogue integrator, or several cascaded analogue integrators. It can also comprise one or more subtractors, one or more summers, and/or one or more weighting coefficients. The number p of analogue integrators generally defines the order of the sigma-delta modulator. The higher the order p of the modulator, the more the number OSR of samples necessary to obtain a digital output value on N-bits can be reduced (given identical quantization noise levels). On the other hand, the sigma-delta modulators are all the more complex to produce when their order is high (stabilization is difficult).

The digital filter comprises, depending on the structure of the modulator, one or more digital integrators (generally at least as many as there are analogue integrators in the modulator), for example counters, and performs a filtering function intended to extract the useful information from the bit stream produced by the sigma-delta modulator. More particularly, the sigma-delta modulator formats the useful signal via its signal transfer function STF, and the quantization noise via its noise transfer function NTF. The STF is the transfer function linking the analogue input signal to be digitized to the output signal of the modulator, and the NTF is the transfer function linking the quantization noise introduced by the 1-bit analogue-digital converter of the modulator on the output signal of the modulator. The NTF makes it possible to push back the quantization noise outside of the band of interest (in which the signal is located). The digital filter is designed so as to extract the signal in the frequency bands in which the attenuation of the quantization noise by the NTF is high (that is to say where the signal is located). The signal transfer function STF is generally equal to 1, and the noise transfer function NTF is expressed, for example, for a modulator of order p, by $NTF(z)=(1-z^{-1})^p$.

There is a need to at least partly improve certain aspects of the existing sigma-delta converters.

SUMMARY OF THE INVENTION

Thus, one embodiment provides a sigma-delta converter comprising a sigma-delta modulator suitable for supplying a series of binary samples representative of an analogue input signal to be digitized, the delivery of a binary sample of the series of binary samples being performed on completion of a cycle of operation of the modulator, a conversion phase comprising a number of cycles necessary to produce a digital converter output value, the modulator comprising at least one analogue filter receiving an internal analogue signal derived from the analogue input signal, in which the contribution to the analogue filter of the analogue signal internal to a given cycle is smaller than the contribution to the analogue filter of the analogue signal internal to the preceding cycle, the contributions to the different cycles being governed by a first law predetermined as a function of the rank of the cycle in the conversion phase.

The analogue filter can be of different type, for example: high-pass, low-pass, bandpass or integrator.

According to one embodiment, the converter further comprises a digital filter suitable for processing the binary samples output from the modulator, the digital filter receiving an internal digital signal in which the contribution to the digital filter of the digital signal internal to a given cycle is smaller than the contribution to the digital filter of the digital signal internal to the preceding cycle, the contributions to the different cycles being governed by a second law predetermined as a function of the rank of the cycle.

The analogue filter and the digital filter are advantageously of the same type.

According to one embodiment, the first and second predetermined laws are identical.

According to one embodiment, the sigma-delta modulator comprises an analogue integration circuit, a 1-bit analogue-digital converter, and a feedback loop, and the analogue signal internal to the modulator is a signal internal to the analogue integration circuit.

According to one embodiment, the analogue integration circuit comprises several cascaded analogue filters.

According to one embodiment, the 1-bit analogue-digital converter comprises a comparator, the analogue input signal to be digitized is applied to an input node of the analogue integration circuit, and a constant potential is applied to a node of application of a comparison threshold potential of the comparator.

According to one embodiment, the 1-bit analogue-digital converter comprises a comparator, the analogue input signal to be digitized is applied to a node of application of a comparison threshold potential of the comparator, and a constant potential is applied to an input node of the analogue integration circuit.

According to one embodiment, the first predetermined variable law is applied to one or more analogue signals internal to the modulator so that all the analogue signals added or subtracted in the modulator are on the same scale with respect to the first law. In other words, the analogue signals can vary within one and the same rank of amplitude for a given rank of amplitude of the analogue input signal.

According to one embodiment, the digital filter comprises at least one digital integrator, and the digital signal internal to the digital filter is an input signal of one of the at least one digital integrator.

According to one embodiment, the digital filter comprises several cascaded digital integrators.

According to one embodiment, the first law comprises at least one phase of decrease during a phase of conversion of an analogue input signal into a digital output signal by the converter.

According to one embodiment, the first law is an exponential law decreasing as a function of the rank of the cycle.

According to one embodiment, the first law is constant during a first part of the conversion phase, and decreases exponentially as a function of the rank of the cycle during a second part of the conversion phase.

According to one embodiment, the first law is constant during a third part of the conversion phase.

According to one embodiment, the analogue input signal is weighted by a coefficient at the input of the modulator, the coefficient being non-zero during a first part of the conversion phase, followed by a second part of the conversion phase during which the coefficient is zero.

According to one embodiment, the first law is modified dynamically according to predetermined rules during the conversion phase.

According to one embodiment, the first law is applied with a phase-shift in terms of number of cycles at the sigma-delta modulator and at the digital filter.

According to one embodiment, at least two distinct laws are applied to distinct internal analogue signals of the modulator.

According to one embodiment, at the modulator, the first variable law is applied by varying a variable capacitance during the conversion phase.

According to one embodiment, the variable capacitance comprises a plurality of switchable capacitances linked in parallel, the values of which correspond respectively to the values obtained by dichotomy from a base capacitance value, the sum of the values of the switchable capacitances being equal to the value of the base capacitance.

According to one embodiment, the converter comprises, at the input of the filter, a weighting device for the internal analogue signal received by the analogue filter applying a variable weighting coefficient $\beta k$, a function of the rank k of the cycle. During the conversion phase, at least two distinct coefficients $\beta k-1$ and $\beta k$ are applied, respectively, for two successive cycles of rank k-1 and k, with $\beta k-1 > \beta k$.

According to one embodiment, the variable weighting coefficient $\beta k$ decreases with the rank k of the cycle.

According to one embodiment, said at least one analogue integrating filter is equivalent to a theoretical circuit comprising a summer between the value of an analogue signal received at the cycle k and an internal signal of the filter corresponding to a multiplication by a coefficient $\alpha$ of the output signal of the analogue filter obtained at the cycle k−1. During the conversion phase, at least one value of the coefficient $\alpha$ strictly greater than 1 is applied for at least one cycle.

According to one embodiment, the coefficient $\alpha$ increases with the rank k of the cycle.

According to one embodiment, the converter is configured so that, during the conversion phase, the following sequence of operations is applied at least once:

for N cycles, N being greater than 1 and less than the number OSR of cycles necessary to produce a digital output value from the converter, after an initial cycle, a decreasingly-variable weighting coefficient $\beta k$ is applied to the internal analogue signal, for M subsequent cycles, M being greater than or equal to 1 and less than the number OSR such that M+N is less than or equal to OSR, the coefficient $\alpha$ of the analogue filter is strictly greater than 1.

According to one embodiment, M is equal to 1 and the coefficient $\alpha$ of the analogue filter takes a value greater than or equal to the inverse of the weighting coefficient $\beta N$ applied at the cycle N, such that the output signal of the analogue filter once again has an amplitude of variation corresponding to the amplitude of variation at the initial cycle and the coefficient $\alpha$ is reset at the end of the N+1 cycle to revert to its value at the initial cycle.

BRIEF DESCRIPTION OF THE DRAWINGS

These features and advantages, and others, will be explained in detail in the following description of particular embodiments given in a nonlimiting manner in relation to the attached figures in which.

DETAILED DESCRIPTION

Elements that are the same have been designated by the same references in the different figures. In the interests of clarity, only the elements that are useful to the understanding of the embodiments described have been represented and are detailed. In particular, the details of production of the digital filters of the sigma-delta converters described have not been represented, the production of these filters being within the scope of a person skilled in the art on reading the present description.

Figure 1A:
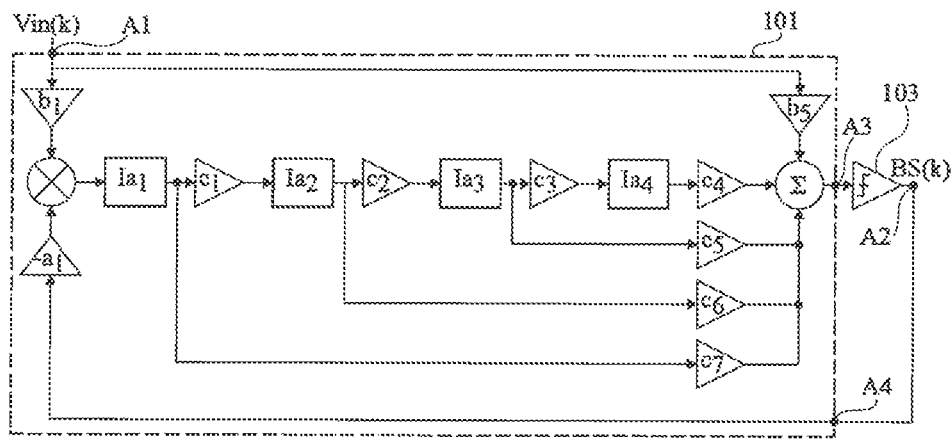
FIGS. 1A and 1B illustrate, in block form, an example of a sigma-delta converter.
Figure 1B:
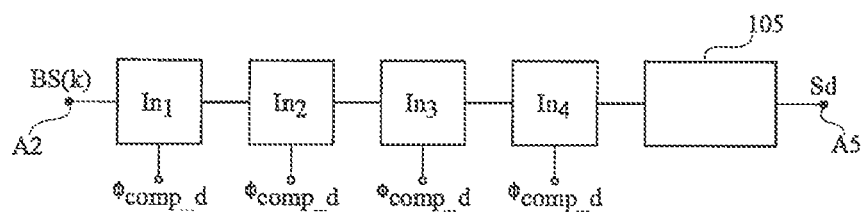

FIGS. 1A and 1B illustrate, in block form, an example of a $4^{th}$ order sigma-delta converter. More particularly, FIG. 1A represents the sigma-delta modulator of the converter, and FIG. 1B represents the digital filter of the converter.

The sigma-delta modulator of FIG. 1A comprises an input terminal A1 intended to receive an analogue input signal Vin to be digitized, and an output terminal A2 intended to supply a series of binary samples BS representative of the signal Vin. For simplification, it is considered here that the analogue input signal to be digitized is constant throughout the time needed to produce an N-bit digital output value, i.e. OSR*$T_{OSR}$, $T_{OSR}$ being the oversampling period of the converter. The embodiments described hereinbelow are not however limited to this particular case and can be adapted to the conversion of variable analogue signals.

The modulator of FIG. 1A comprises an analogue integration circuit 101 comprising a first input connected to the terminal A1 for application of the signal Vin, and an output A3 linked to the input of a 1-bit analogue-digital conversion circuit 103, for example a 1-bit comparator. The output of the converter 103 is connected to the output A2 of the modulator, and is also linked by a feedback loop to a second input A4 of the integration circuit 101. In the example represented, it is considered that the input signal Vin and the output signal BS of the modulator are normalized, that is to say that the value 0 of the binary signal BS corresponds to a voltage level equal to the smallest value that the analogue signal Vin can take, and that the value 1 of the signal BS corresponds to a voltage level equal to the greatest value that the signal Vin can take. Thus, in the example represented, the feedback loop is a simple conductive track linking the terminal A2 to the terminal A4, and the feedback signal is directly the signal BS. In the case where the output binary signal BS is not to the same scale as the input signal Vin, the feedback loop can include a 1-bit digital-analogue converter between the terminals A2 and A4, the feedback signal then being the output signal of the 1-bit digital-analogue converter.

At each cycle k of duration $T_{OSR}$ of a phase of conversion of the input signal Vin into a digital value, with k being an integer ranging from 1 to OSR, the integration circuit 101 takes an analogue sample Vin(k) of the input signal, and the modulator supplies, at the output of the 1-bit analogue-digital converter 103, a binary sample BS(k) of the output signal.

In the example of FIG. 1A, the integration circuit 101 comprises four cascaded analogue integrators $Ia_1$, $Ia_2$, $Ia_3$ and $Ia_4$, and a summing circuit $\Sigma$. Each integrator comprises an input and an output, and has, for example, a $z/(z-1)$ transfer function, that is to say that, at each cycle, the integrated signal, or output signal of the integrator, is increased by the value of the signal applied at the input of the integrator.

In the example represented, the integrator $Ia_1$ receives on its input a signal equal to the difference between the input signal Vin(k) weighted by a coefficient $b_1$, and the feedback signal BS(k−1) weighted by a coefficient $a_1$. The integrator $Ia_2$ receives on its input a signal equal to the output signal of the integrator $Ia_1$ weighted by a coefficient $c_1$. The integrator $Ia_3$ receives on its input a signal equal to the output signal of the integrator $Ia_2$ weighted by a coefficient $c_2$. The integrator $Ia_4$ receives on its input a signal equal to the output signal of the integrator $Ia_3$ weighted by a coefficient $c_3$. The summing circuit adds the input signal Vin(k) weighted by a coefficient $b_5$, and the output signals of the integrators $Ia_1$, $Ia_2$, $Ia_3$ and $Ia_4$, weighted respectively by coefficients $c_7$, $c_6$, $c_5$ and $c_4$. The output of the summing circuit $\Sigma$ is connected to the output terminal A3 of the circuit 101.

Numerous variant architectures of sigma-delta modulators can be envisaged. Generally, the embodiments described apply to sigma-delta modulators of order p greater than or equal to 1, in which each of the p analogue integrators $Ia_j$, with j being an integer ranging from 1 to p, receives on its input a signal equal to the difference between the input signal Vin(k) weighted by a coefficient $b_j$ and the feedback signal BS(k−1) weighted by a coefficient $a_j$, to which is added, if the rank j of the integrator $Ia_j$ is greater than 1, the output signal of the modulator $Ia_{j-1}$ of preceding rank weighted by a coefficient $c_{j-1}$. The summing circuit $\Sigma$ adds the input signal Vin(k) weighted by a coefficient $b_{p+1}$, the output signal of the integrator $Ia_p$ of rank p weighted by a coefficient $c_p$, and, if p is greater than 1, the output signal or signals of the integrators of rank p−l, with l being an integer ranging from 1 to p−1, weighted respectively by coefficients $c_{p+l}$. Some of the abovementioned coefficients can be zero. For example, in the $4^{th}$ order modulator of FIG. 1, the coefficients $b_2$, $b_3$, $b_4$, $a_2$, $a_3$ and $a_4$ are zero. It will be noted that the embodiments described can also be applied to modulators further comprising one or more analogue inverse feedbacks from the output of an analogue integrator to the input of an upstream analogue integrator, through a specific weighting coefficient, and/or in which the output of an integrator of rank i is added, through a specific weighting coefficient, to the input of a downstream integrator of rank greater than or equal to i+2. Furthermore, delays can be introduced between the different stages of the circuit 101, and/or between the circuit 101 and the converter 103.

The digital filter of a sigma-delta converter generally comprises a digital integrator, or several cascaded digital integrators. Preferably, a pth order sigma-delta modulator is associated with a digital filter comprising a number greater than or equal to p of digital integrators. In the example of FIG. 1B, the digital filter comprises four cascaded digital integrators $In_1$, $In_2$, $In_3$ and $In_4$. Each digital integrator, for example a counter, comprises an input and an output and, at each cycle, the integrated signal, or output signal of the integrator, is increased by the value of the signal applied at the input of the integrator. The first integrator $In_1$ receives on its input the output binary signal BS of the sigma-delta modulator of FIG. 1A, the second integrator $In_2$ receives on its input an output digital signal from the integrator $In_1$, the third integrator $In_3$ receives on its input an output digital signal from the integrator $In_2$, and the fourth integrator $In_4$ receives on its input an output digital signal from the integrator $In_3$. The filter of FIG. 1B performs a function of low-pass type intended to extract the useful information from the bit stream produced by the sigma-delta modulator. More generally, the digital filter extracts the signal at the frequencies where the attenuation of the NTF is greatest. Thus, depending on the structure of the modulator, the digital filter can perform a low-pass function, a bandpass function, or a high-pass function.

The digital integration is performed at the oversampling frequency of the sigma-delta modulator. In the example represented, the four digital integrators $In_j$ are controlled simultaneously by the same control signal $\Phi_{comp\_d}$, of frequency $1/T_{OSR}$. The output of the last digital integrator $In_4$ is linked to a normalization block 105 whose function is to convert the signal supplied by the integrator $In_4$ into a digital code on N-bits, N being an integer greater than 1 corresponding to the resolution of the sigma-delta converter. As an example, the block 105 divides the signal that it receives by a reference value, for example equal to the value that this signal would take for the maximum value allowed for the signal Vin, and supplies on an output terminal A5 of the converter an output value $S_d$ representative of the result of the division quantized on N bits.

Miscellaneous variant architectures of digital filters can be envisaged. In particular, the topology of the digital filter can be modified to approximate that of the sigma-delta modulator. For example, instead of receiving on its input only the output signal from the last digital integrator $In_4$ as in the example of FIG. 1B, the normalization circuit 105 can receive a signal equal to the sum of the output signals from the four integrators $In_1$, $In_2$, $In_3$ and $In_4$. Furthermore, to approximate even more the topology of the sigma-delta modulator, the internal digital signals of the digital filter can be weighted by coefficients identical to those of the modulator.

Figure 2:
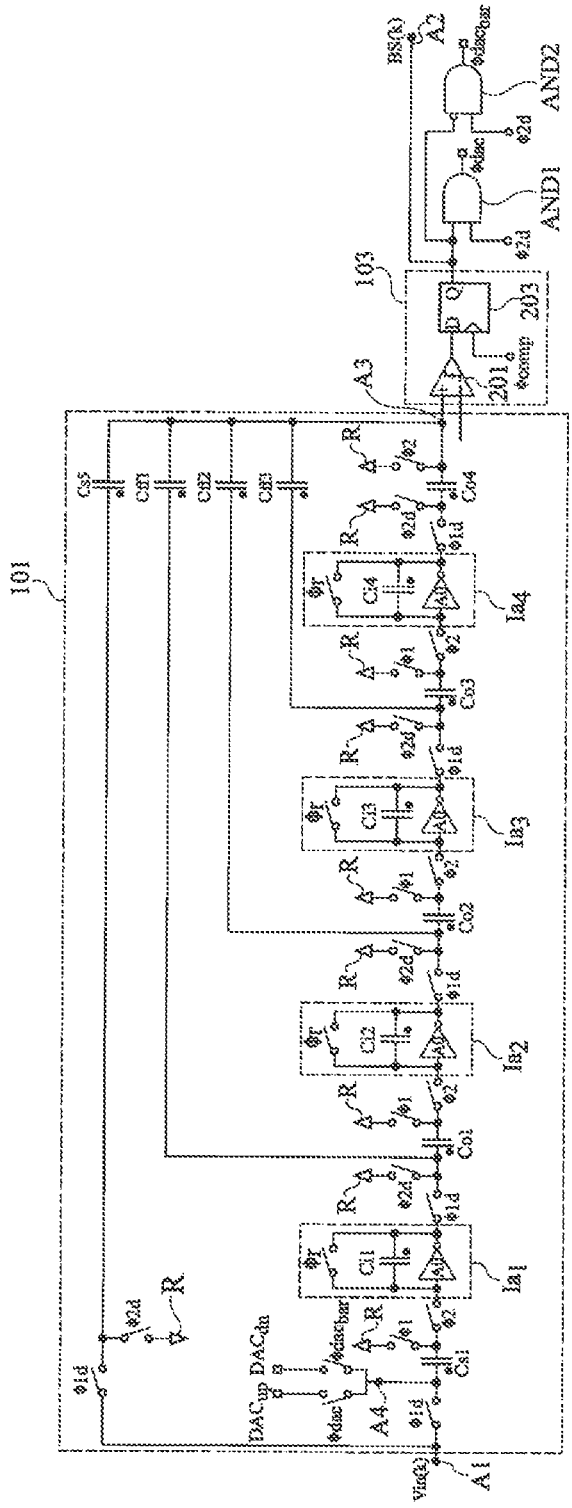
FIG. 2 is a detailed electrical circuit diagram of an exemplary embodiment of the sigma-delta modulator of FIG. 1A.

FIG. 2 is a detailed electrical circuit diagram illustrating an exemplary (nonlimiting) embodiment of the sigma-delta modulator of FIG. 1A.

In the example of FIG. 2, each integrator $Ia_j$ comprises an operational amplifier AO whose input is linked to the output by an integrator capacitance Cij. The input and the output of the operational amplifier form, respectively, the input and the output of the integrator. Each integrator $Ia_j$ further comprises, in parallel to its integration capacitance Cij, a reset switch controlled by a signal $\Phi r$. Hereinafter in the description, for simplicity, the switches of the modulator are designated by the same references as their respective control signals.

The outputs of the integrators $Ia_1$, $Ia_2$, $Ia_3$ and $Ia_4$ are linked respectively to a first electrode of a capacitance Co1, to a first electrode of a capacitance Co2, to a first electrode of a capacitance Co3 and to a first electrode of a capacitance Co4, by first, second, third and fourth switches $\Phi 1d$. Moreover, the first electrodes of the capacitors Co1, Co2, Co3 and Co4 are linked to a node R for application of a reference potential, for example equal to the average potential between the high output value $DAC_{up}$ and the low output value $DAC_{dn}$ of the feedback digital-analogue converter, respectively by first, second, third and fourth switches $\Phi 2d$. The second electrodes of the capacitors Co1, Co2 and Co3 are linked to the node R respectively by first, second and third switches $\Phi 1$. Furthermore, the second electrodes of the capacitors Co1, Co2 and Co3 are linked respectively to the input of the integrator $Ia_2$, to the input of the integrator $Ia_3$, and to the input of the integrator $Ia_4$, by first, second and third switches $\Phi 2$. The second electrode of the capacitance Co4 is linked to the node R by a fourth switch $\Phi 2$, and is also connected to the input A3 of the analogue-digital converter 103.

The modulator of FIG. 2 further comprises a capacitance Cs1 of which a first electrode is linked to the terminal A1 for application of the input signal Vin by a fifth switch $\Phi 1d$, and of which the second electrode is linked to the input of the integrator $Ia_1$ by a fifth switch $\Phi 2$. The second electrode of the capacitance Cs1 is also connected to the node R by a fourth switch $\Phi 1$. Moreover, the first electrode of the capacitance Cs1 is linked to a node for application of a potential DACup by a switch $\Phi dac$, and to a node for application of a potential DACdn lower than the potential DACup by a switch $\Phi dac_{bar}$.

The terminal A1 for application of the input signal Vin is also linked to a first electrode of a capacitance Cs5 by a sixth switch $\Phi 1d$. The first electrode of the capacitance Cs5 is also linked to the node R by a fifth switch $\Phi 2d$. The second electrode of the capacitance Cs5 is connected to the input node A3 of the analogue-digital converter 103.

Moreover, the first electrodes of the capacitors Co1, Co2 and Co3 are linked to the input node of the analogue-digital converter 103 respectively by capacitors Cff1, Cff2 and Cff3.

In this example, the 1-bit analogue-digital converter 103 comprises a comparator 201 and a flip-flop 203. The input of the comparator 201 forms the input of the converter 103. The output of the comparator 201 is connected to the input of the flip-flop 203. The output of the flip-flop 203 forms the output A2 of the converter 103, supplying the output signal BS of the sigma-delta modulator. In operation, the output of the comparator 201 switches from a high state to a low state depending on whether the signal applied to the terminal A3 is above or below a threshold, for example equal to the reference potential applied to the node R. The flip-flop 203 samples the output signal of the comparator 201 and copies it onto the output of the modulator on each rising or falling edge of a control signal $\Phi comp$.

The modulator of FIG. 2 further comprises two AND gates AND1 and AND2 each comprising two binary inputs and a binary output. The inputs of the gate AND1 are connected respectively to the output A2 of the converter 103 and to the control signal $\Phi 2d$, and the inputs of the gate AND2 respectively receive a signal complementing the output signal of the converter 103 and the control signal $\Phi 2d$. The output of the gate AND1 is connected to a control node of the switch $\Phi dac$, and the output of the gate AND2 is connected to a control node of the switch $\Phi dac_{bar}$.

The integrators $Ia_1$, $Ia_2$, $Ia_3$ and $Ia_4$, the capacitors Cs1, Co1, Co2, Co3, Co4, Cs5, Cff1, Cff2 and Cff3, and the switches $\Phi 1$, $\Phi 2$, $\Phi 1d$ and $\Phi 2d$ form the analogue integration circuit 101 of the modulator. The switches $\Phi dac$ and $\Phi dac_{bar}$ and the gates AND1 and AND2 form the 1-bit digital-analogue converter of the feedback loop of the modulator.

Figure 3:
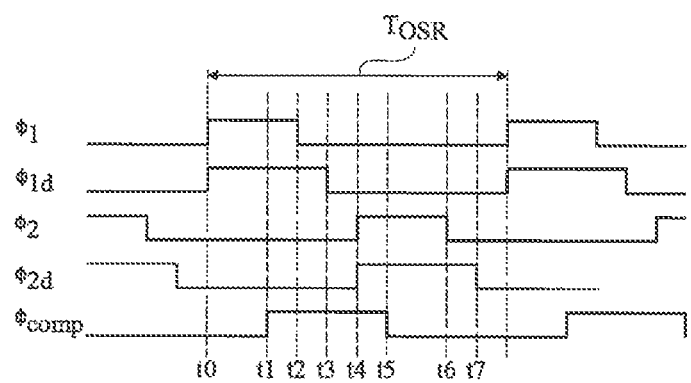
FIG. 3 is a timing diagram illustrating the trend, as a function of time, of control signals of the modulator of FIG. 2.

FIG. 3 is a timing diagram illustrating the trend, as a function of time, of the control signals $\Phi 1$, $\Phi 1d$, $\Phi 2$, $\Phi 2d$ and $\Phi comp$ of the modulator of FIG. 2 according to an exemplary method for controlling this modulator. More particularly, FIG. 3 illustrates the trend of the signals $\Phi 1$, $\Phi 1d$, $\Phi 2$, $\Phi 2d$ and $\Phi comp$ during a cycle $T_{OSR}$ corresponding to an oversampling period of the modulator. As an example, the acquisition of a digital value on N bits representative of the input signal Vin can comprise an initial phase of reset of the analogue integrators $Ia_1$, $Ia_2$, $Ia_3$ and $Ia_4$, during which the switches Φr are closed so as to discharge the integrator capacitors Ci1, Ci2, Ci3 and Ci4. At the end of this reset phase, the switches Φr can be opened, then the control sequence of duration $T_{OSR}$ illustrated in FIG. 3 can be repeated OSR times (in the case of an incremental sigma-delta converter reset between two successive analogue-digital conversions, or more than OSR times if it is not an incremental converter).

At an instant t0 of start of a modulator control cycle $T_{OSR}$, the switches Φ1 and Φ1d are controlled to the closed state (control signals corresponding to the 1 state in this example), and the switches Φ2 and Φ2d are controlled to the open state (control signals corresponding to the 0 state in this example). This leads to the sampling of the input signal Vin on the input capacitor Cs1 of the integrator $Ia_1$, and of the output signals of the integrators $Ia_1$, $Ia_2$, $Ia_3$ respectively on the input capacitors Co1, Co2 and Co3 of the integrators $Ia_1$, $Ia_2$ and $Ia_3$. Since the sampled signals are voltages, each capacitor stores a quantity of charges proportional to the product of the sampled voltage by the value of the sampling capacitor. During this phase, the signals stored in the capacitors Cs5, Cff1, Cff2, Cff3 and Co4 are summed on the output node A3 of the circuit 101, which constitutes the summer Σ of FIG. 1A. The weighted summing of the signals stored in these capacitors is thus performed, the weighting applied resulting from the values of the capacitors.

At an instant t1 after the instant t0, the signal Φcomp is set to the high state. The input signal of the analogue-digital converter 103 (voltage of the node A3) is quantized on one bit by the converter 103 on the rising edge of the signal Φcomp. The binary value of the output signal BS is thus updated.

At an instant t2 after the instant t1, the signal Φ1 is set to the low state, and, at an instant t3 after the instant t2, the signal Φ1d is set to the low state.

At an instant t4 after the instant t3, the signals Φ2 and Φ2d are set to the high state. The result therein is that the values of the integrators $Ia_1$, $Ia_2$, $Ia_3$ and $Ia_4$ are updated, that is to say that the sampled charges in the capacitors Cs1, Co1, Co2, Co3 are integrated in the capacitors Ci1, Ci2, Ci3, Ci4 respectively. Furthermore, the inverse feedback is activated, that is to say that the signal DACup or DACdn (depending on whether the signal BS is in the high or low state), is subtracted from the input signal of the capacitance Cs1.

At an instant t5, after the instant t4 in this example, the signal Φcomp is reset to the low state.

At an instant t6 after the instant t4, the signal Φ2 is set to the low state, and, at an instant t7 after the instant t6, the signal Φ2d is set to the low state.

After the instant t7, the abovementioned cycle can recommence.

The quantization is performed during the phase Φ1=1, and the integration of the new inverse feedback is performed during the phase Φ2=1.

The output binary digital value BS(k) of the modulator obtained at each cycle $T_{OSR}$ is integrated by the digital filter at the oversampling frequency of the modulator, for example on the rising edges of the signal $\Phi_{comp\_d}$, which can be a delayed copy of the signal $\Phi_{comp}$ (with a delay less than $T_{OSR}$).

The values of the capacitors Cs1, Cs5, Co1, Co2, Co3, Co4, Cff1, Cff2, Cff3 set the values of the coefficients $b_1$, $b_5$, $a_1$, $c_1$, $c_2$, $c_3$, $c_4$, $c_5$, $c_6$, $c_7$ of the modulator, for example according to the following relationships: Ci1=2*Cs1/$c_1$; Ci2=Co1/$c_2$; Ci3=Co2/$c_3$; Ci4=Co3/$c_4$; Cff1=Cs5*($c_7$/($c_1$*$b_5$)); Cff2=Cs5*($c_6$/($c_2$*$b_5$)); Cff3=Cs5*($c_5$/($c_3$*$b_5$)); and Co4=Cs5/$b_5$.

An important feature of a sigma-delta converter is its linearity. The non-linearity error, generally referred to in the art by the acronym INL (Integral Non Linearity), is the maximum difference (peak-to-peak error), over the rank of operation of the converter, between the transfer function of the converter (which correlates a digital output code with each value of the analogue input signal), and the ideal linear transfer function. The linearity error can be expressed in LSB (Least Significant Bit), where 1 LSB=($Vin_{max}$−$Vin_{min}$)/$2^N$, $Vin_{max}$ and $Vin_{min}$ being, respectively, the maximum value and the minimum value of the analogue input signal over the rank of operation of the converter, and N being the quantization resolution of the converter. The linearity L of the converter can be defined by the following formula: L=$\log_2$(($Vin_{max}$−$Vin_{min}$)/(INL*LSB)).

Another important feature of a sigma-delta converter is its output noise B, which can be defined as being the average, over the rank of operation [$Vin_{min}$, $Vin_{max}$] of the converter (over a significant number of conversions for each point of the input dynamic range), of the standard deviations of the output digital codes of the converter of each level of the analogue input signal.

Figure 4:
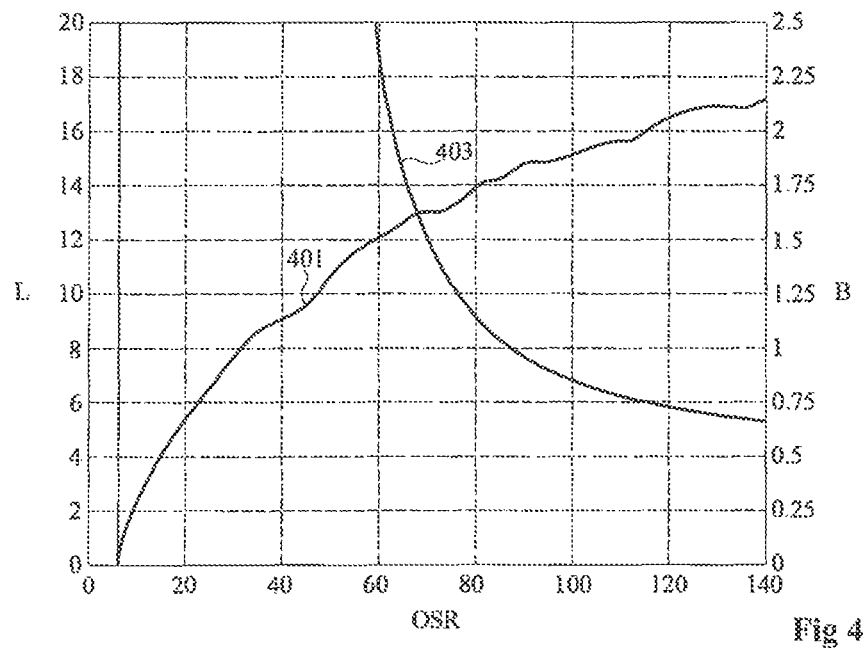
FIG. 4 is a diagram illustrating the trend of the linearity and of the noise, as a function of the OSR, in a sigma-delta converter of the type described in relation to FIGS. 1 to 3.

FIG. 4 is a diagram illustrating the trend of the linearity L and of the noise B, as a function of the OSR, in a sigma-delta converter of the type described in relation to FIGS. 1 to 3. More particularly, the curve 401 represents the trend of the linearity L (y axis on the left) as a function of the OSR (x axis), and the curve 403 represents the trend of the noise B expressed in LSB (y axis on the right) as a function of the OSR. In this example, a sigma-delta converter performing a quantization on N=16 bits has been considered.

As appears in FIG. 4, the more the OSR increases, the more the linearity L increases, and the more the noise B decreases. As an example, an OSR equal to 100 makes it possible to have a linearity value L equal to 15 and a noise level B equal to 0.85 LSB, whereas an OSR equal to 60 gives only a linearity L equal to 12 and a noise level B equal to 2.4 LSB.

It would be desirable to be able to improve the linearity of a sigma-delta converter for a given OSR, or, for a given linearity value, or to be able to reduce the OSR, and do so without significantly degrading the output noise of the converter.

The proposed solution, which will now be described, is most particularly advantageous for order sigma-delta converters greater than 1, in which it makes it possible to significantly improve the OSR/linearity trade-off. However, this solution is compatible with $1^{st}$ order sigma-delta converters, in which it also makes it possible to improve the OSR/linearity trade-off (and also to increase the signal-to-noise ratio relative to the signal to noise induced by quantization noise ratio, for example generally defined by $\log_2(((3*OSR^3)/(\pi^2/12))^{1/2})$ in a $1^{st}$ order modulator without variable coefficient.

According to one aspect of an embodiment, a sigma-delta converter is provided in which, during the acquisition of a digital value on N-bits representative of the analogue input signal, at least one weighting coefficient of the sigma-delta modulator varies dynamically according to a predetermined law f. Preferably, at least one digital signal internal to the digital filter is also weighted by a predetermined variable law, for example, but not necessarily, by the same law f as that applied in the modulator.

This constitutes a difference compared to the known sigma-delta converters, in which the weighting coefficients of the modulator are set, and in particular, remain constant during the OSR sampling cycles of a phase of analogue-digital conversion of the input signal. Furthermore, in the known sigma-delta converters, no signal internal to the digital filter is weighted by a dynamically variable coefficient during the OSR sampling cycles of a phase of analogue-digital conversion of the input signal.

It will be noted that the weighting coefficient of the modulator to which the law f is applied can for example have an initial value (before modulation by the law f) equal to 1 (as an example, a link wire without apparent coefficient corresponds to a unitary coefficient, and it is possible to choose to apply the law f to this coefficient). The embodiments described are not however limited to this particular case.

Figure 5A:
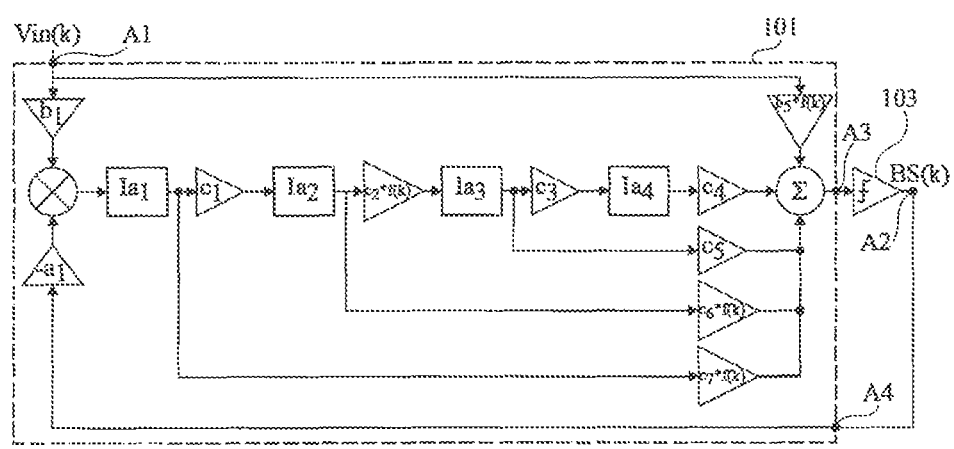
FIGS. 5A and 5B illustrate, in block form, an example of an embodiment of a sigma-delta converter.
Figure 5B:
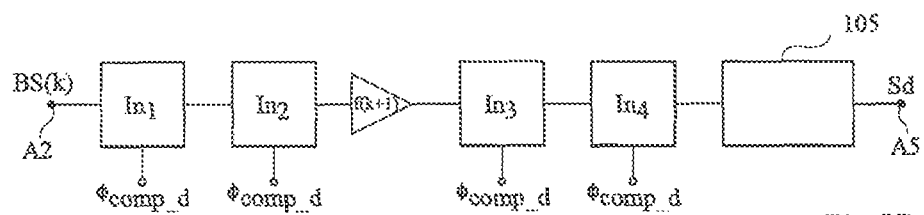

FIGS. 5A and 5B illustrate, in block form, an example of an embodiment of a sigma-delta converter. In the example represented, the converter is a $4^{th}$ order converter. FIG. 5A represents the sigma-delta modulator of the converter, and FIG. 5B represents the digital filter of the converter.

The sigma-delta converter of FIGS. 5A and 5B has elements in common with the sigma-delta converter of FIGS. 1A and 1B. These elements will not be detailed again. Only the differences between the two converters will be explained hereinbelow.

The sigma-delta modulator of FIG. 5A differs from the sigma-delta modulator of FIG. 1A essentially in that, in the modulator of FIG. 5A, the weighting coefficients $c_2$, $c_6$, $c_7$ and $b_5$ are modulated by a same predetermined variable law f. At each sampling cycle k of a phase of analogue-digital conversion of the input signal, with k being an integer ranging from 1 to OSR, the value f(k) of the law f is capable of taking a new value. Thus, the set weighting coefficients $c_2$, $c_6$, $c_7$ and $b_5$ of the modulator of FIG. 1A are replaced by variable coefficients $c_2*f(k)$, $c_6*f(k)$, $c_7*f(k)$ and $b_5*f(k)$. The law f(k) is preferably non-binary. The OSR f(k) values of the law f are for example stored in a memory of a control circuit (not represented) of the sigma-delta converter. An example of a circuit making it possible to apply a variable weighting law to coefficients of the modulator will be described in more detail hereinbelow in relation to FIG. 12. The base values (not modulated by the law f) of the coefficients $c_2$, $c_6$, $c_7$ and $b_5$, like the values of the set coefficients $b_1$, $a_1$, $c_1$, $c_3$, $c_4$ and $c_5$, can be determined by the usual methods for determining the coefficients of a sigma-delta modulator, for example according to the dimensioning rules described in the article entitled "Automatic coefficients design for high-order sigma-delta modulators" by Kuo, T. H., Chen, K. D., and Chen, J. R. (Circuits and Systems II: Analog and Digital Signal Processing, IEEE Transactions, Volume 46, Issue 1), or in the document "Understanding Delta-Sigma Data Converters" (John Wiley & Sons, New York, 2004).

The digital filter of FIG. 5B differs from the digital filter of FIG. 1B essentially in that, in the filter of FIG. 5B, the variable weighting law f applied to the coefficients $c_2$, $c_6$, $c_7$ and $b_5$ of the sigma-delta modulator is also applied to the digital input signal of the digital integrator of rank 3 $In_3$. In the example represented, the variable law f is applied at the digital filter with an advance cycle relative to the modulator, that is to say that, during a sampling cycle $T_{OSR}$ of the sigma-delta converter, if the weighting value f(k) is applied to the coefficients $c_2$, $c_6$, $c_7$ and $b_5$ of the modulator, the weighting value f(k+1) is applied to the input signal of the digital integrator $In_3$. The inventors have in fact observed that this offset of one cycle makes it possible to obtain particularly good performance levels in terms of linearity. The embodiments described are not however limited to this particular case. As a variant, the law f can be applied in phase at the modulator and at the digital filter, or with an advance greater than one cycle in the digital filter, or with a delay of one cycle or more in the digital filter. In another variant embodiment, the law f can be applied with a phase shift of one cycle or more to distinct coefficients of the modulator, or to distinct signals of the digital filter. For example, during one and the same cycle k of a phase of analogue-digital conversion of the input signal, the coefficient a1 of the modulator can be weighted by the value f(k), and the coefficient b1 by the value f(k+1).

The embodiments described are not limited to the particular example of FIGS. 5A and 5B, in which the sigma-delta converter is a $4^{th}$ order converter and in which the weighting law f(k) is applied to the coefficients $c_2$, $c_6$, $c_7$ and $b_5$ of the modulator, and that input for the digital integrator of rank 3 of the digital filter.

More generally, whatever the order of the converter, the choice of the coefficient or coefficients of the modulator to which the weighting law f(k) is applied is preferably such that at least one input coefficient of an analogue integrator $Ia_j$ of the modulator is modulated by the law f. Furthermore, in a preferred embodiment, at least one input coefficient of a digital integrator $In_k$ of the digital filter is modulated by the law f, preferably with j=k.

Preferably, provision is also made for the analogue signals added or subtracted in the modulator to be to the same scale with respect to the law f(k), that is to say that they have been multiplied or divided a same number of times (possibly zero) by the law f(k). In other words, a rescaling allows the analogue signals to vary within a same range of amplitude for a given range of amplitude of the analogue input signal (Vin). The choice of the coefficient or coefficients of the modulator to which the weighting law f(k) is applied can for example be made such that all the samples that make up the integrated output signal of the analogue integration circuit 101 are to the same scale with respect to the law f(k). Preferably, provision is made for at least one input coefficient of an analogue integrator $Ia_i$ to be modulated by the law f, and for all the signals added to or subtracted from the weighted signal, whether at the input of the integrator $Ia_i$ or on the downstream path (after output from the integrator $Ia_i$), to be, preferably, to the same scale with respect to the law f. A signal is considered to scale with respect to the law f if it is situated on the path downstream of an integrator having an upstream coefficient weighted by the law f, or if it is itself directly weighted by the law f.

As an example, the choice of the coefficient or coefficients of the modulator to which the weighting law f(k) is applied is made such that all the samples that make up the integrated output signal of the circuit 101 are multiplied (directly, or indirectly if the sample is an output sample of an integrator having an upstream coefficient weighted by the law f) by the law f(k). This rule is in particular observed in the modulator of FIG. 5A, in which all the samples which make up the input signals of the summer Σ are multiplied directly or indirectly by the law f(k) (directly for the signals involving the variable coefficients $b_5*f(k)$, $c_6*f(k)$ and $c_7*f(k)$, and indirectly for the signals involving the set coefficients $c_4$ and $c_5$, in as much as the signals have, upstream, involved the variable coefficient $c_2*f(k)$). As a variant, and by observing this same rule, the coefficients of the modulator to which the law f(k) is applied can be the coefficients $b_1$, $a_1$ and $b_5$, or in another variant the coefficients $c_1$, $b_5$ and $c_7$, or in another variant the coefficients $c_3$, $b_5$, $c_5$, $c_6$ and $c_7$. The weighting of the set of coefficients c4, c5, c6, c7 and c5 by the law f is, for its part, less advantageous in as much as no upstream coefficient of an analogue integrator is modulated by the law f.

At the digital filter, the weighting law f(k) can be applied to a signal other than the input signal of the digital integrator of rank 3 $In_3$. More generally and as in the modulator, the choice of the digital signals to which the law f(k) is applied is preferably made such that the weighting law f(k) is applied as input of at least one digital integrator, preferably of the integrator of the same rank j as the analogue integrator $Ia_j$ at the input of which the law f(k) is applied in the modulator. Furthermore, as in the modulator, the choice of the digital signals to which the law f(k) is applied is preferably made such that the digital signals added or subtracted in the digital filter are to the same scale with respect to the law f(k). Preferably, the digital filter comprises a number of cascaded digital integrators greater than or equal (preferably equal) to the order p of the sigma-delta modulator. Furthermore, if the digital filter has a topology similar to that of the modulator, the law f(k) can be applied substantially at the same points in the modulator and in the digital filter.

As a variant, to observe the scaling of the intermediate signals combined to form the output signal of the analogue integration circuit 101 of the modulator, some intermediate signals can be multiplied by the law f(k), and others divided by the law f(k). For example, the coefficient $c_2$ can be multiplied by the law f(k) and the coefficients $c_4$ and $c_5$ divided by the law f(k) so as to conserve one and the same scale at the summer, the other coefficients of the modulator remaining constant. In this case, the weighting by the law f(k) at the digital filter can be identical to that which was described previously (multiplication of the input signal of the integrator $In_3$ by the law f(k)).

The inventors have found that whatever the law f chosen, and in as much as the law f has at least one phase of decrease over the range of the indices k ranging from 1 to OSR, the application of a variable weighting coefficient to at least one analogue signal internal to the sigma-delta modulator and advantageously to at least one internal digital signal of the digital filter makes it possible to significantly improve the linearity of the sigma-delta converter (for a given OSR). The phase of decrease is a function of the rank k of the cycle. The phase of decrease generates a contribution to the analogue filter of the analogue signal internal to a given cycle (k) which is smaller than the contribution to the analogue filter of the same analogue signal internal to the preceding cycle (k−1). At least one decreasing contribution between two cycles of successive rank already provides an advantage. As an example, the law f can be a law decreasing over all the range of the indices k ranging from 1 to OSR, for example a decreasing exponential law. As a variant, the law f can be a constant law, for example equal to 1, over the range of the indices k ranging from 1 to t, with t being an integer lying between 1 and OSR, and decreasing (for example according to an exponential) over the range of the indices k ranging from t+1 to OSR.

Figure 6:
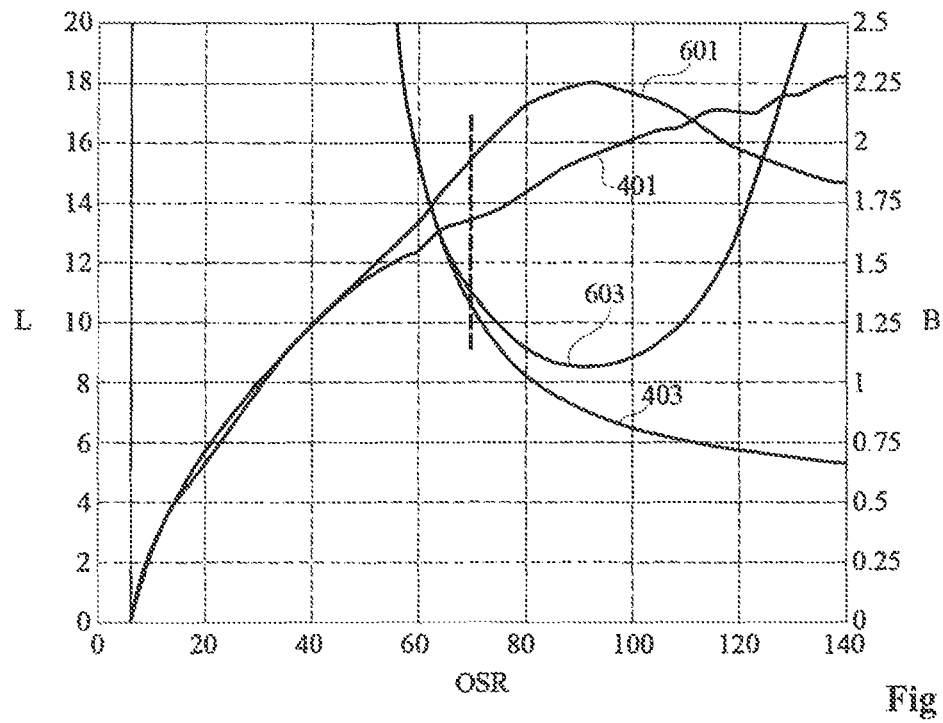
FIG. 6 is a diagram illustrating the trend of the linearity and of the noise, as a function of the OSR, in a sigma-delta converter of the type described in relation to FIGS. 5A and 5B.
Figure 7:
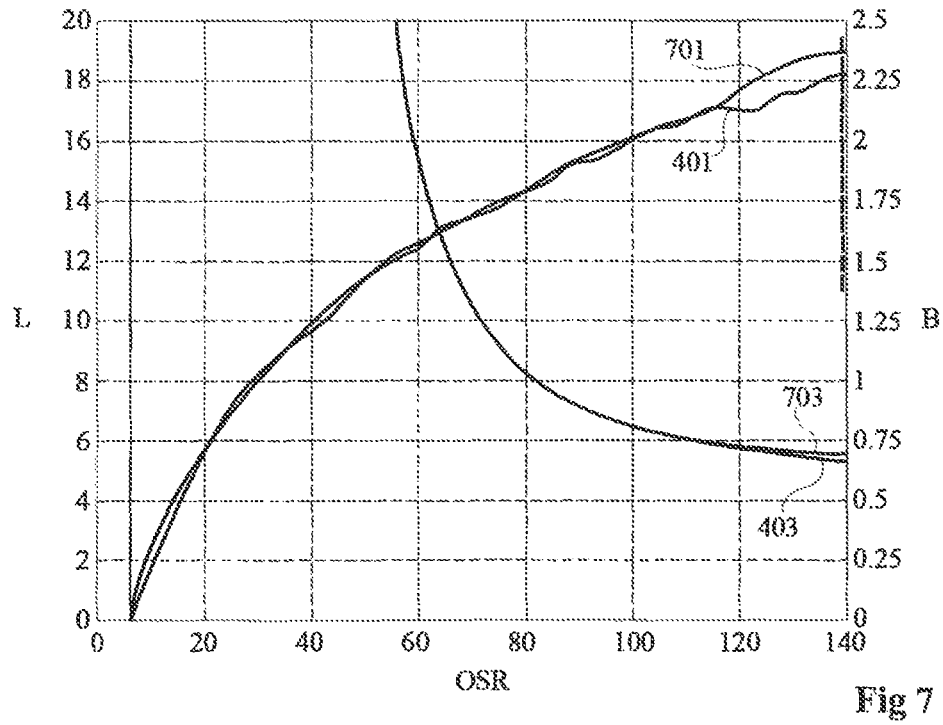
FIG. 7 is a diagram illustrating the trend of the linearity and of the noise, as a function of the OSR, in another exemplary sigma-delta converter of the type described in relation to FIGS. 5A and 5B.
Figure 8:
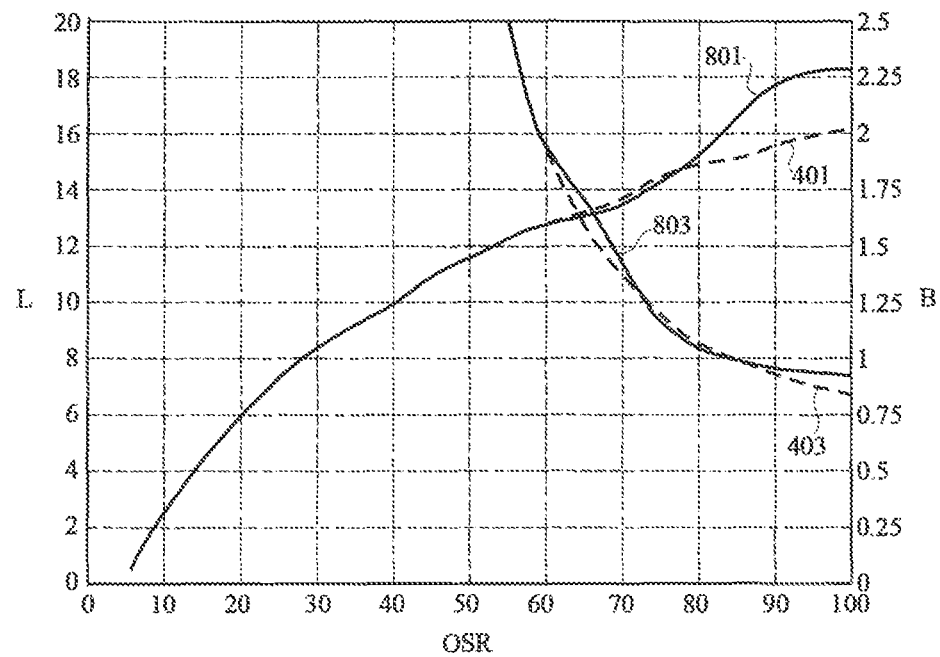
FIG. 8 is a diagram illustrating the trend of the linearity and of the noise, as a function of the OSR, in another exemplary sigma-delta converter of the type described in relation to FIGS. 5A and 5B.

FIGS. 6, 7 and 8 are diagrams illustrating, for three distinct laws f, the trend of the linearity L and of the noise B as a function of the OSR in a sigma-delta converter of the type described in relation to FIGS. 5A and 5B.

In the example of FIG. 6, the dynamic weighting law applied to the sigma-delta converter is given by the equation $f(k)=e^{-k/25}$.

In the example of FIG. 7, the dynamic weighting law applied to the sigma-delta converter is defined as follows:

for $k<100$, $f(k)=1$; and for $k>=100$, $f(k)=e^{-(k-100)/20}$.

In the example of FIG. 8, the dynamic weighting law applied to the sigma-delta converter is defined as follows:

for $k<60$, $f(k)=1$;

for $60<=k<75$, $f(k)=e^{-(k-40)/20}$; and for $k>=75$, $f(k)=e^{-(75-40)/20}$.

In FIGS. 6, 7 and 8, the curves 601, respectively 701, respectively 801, represent the trend of the linearity L (y axis on the left) as a function of the OSR (x axis), and the curves 603, respectively 703, respectively 803, represent the trend of the noise B expressed in LSB (y axis on the right) as a function of the OSR. In this example, a sigma-delta converter performing a quantization on N=16 bits has been considered. The curves of linearity 401 and of noise 403 of FIG. 4, which correspond to the same sigma-delta converter but in which no dynamic weighting of the signals is performed, have also been plotted in FIGS. 6, 7 and 8 for comparison purposes.

In FIG. 6, it can be seen that, for an OSR equal to 70, the noise is substantially unchanged in relation to the example of FIG. 4, but that the linearity is clearly improved, since it changes from a value approximately equal to 13.5 to a value approximately equal to 15.5. For higher OSRs, it is found that the linearity continues to improve in relation to the example of FIG. 4, but that the noise increases significantly. This increase in the noise for the high OSRs can notably be explained by the significant attenuation of the samples of high index k by the law f(k).

In FIG. 7, it can be seen that, for an OSR equal to 140, the linearity is increased by approximately 0.8 in relation to the example of FIG. 4, and that the noise remains substantially at the same level as in the example of FIG. 4, i.e. approximately 0.70 LSB.

In FIG. 8, it can be seen that, for an OSR equal to 100, the linearity is increased by approximately 2 in relation to the example of FIG. 4, and that the noise remains substantially at the same level as in the example of FIG. 4.

Generally, it is observed that the laws of the type used in the example of FIG. 7, that is to say comprising a unitary constant phase at the start of the phase of analogue-digital conversion of the input signal, followed by a decreasing phase, for example exponential, at the end of the conversion phase, or the laws of the type used in the example of FIG. 8, that is to say comprising a unitary constant phase at the start of the analogue-digital conversion phase, followed by a decreasing phase, for example exponential, at an intermediate stage of the conversion phase, then by a constant phase of low level at the end of the conversion phase, make it possible to obtain a good trade-off in terms of noise and of linearity.

Of course, the ranges of OSR values of interest, that is to say in which a linearity gain is observed without the noise being degraded significantly, depend on numerous parameters and in particular on the order of the modulator.

It will also be noted that the gain in linearity can differ according to the point of the modulator where the weighting by the law f(k) is applied. In particular, the more upstream the weighting is applied in the modulator, the higher the gain in linearity, but the more the increase in the output noise will be significant if considering a modulator in which each block is subjected to a temporal noise.

To assist in the choice of a weighting law f(k) suited to the targeted application, the following considerations can be taken into account.

Saturation:

The initial (unweighted) values of the coefficients of the modulator can be determined by usual methods for determining the coefficients of a sigma-delta modulator. Generally, to maximize the signal-to-noise ratio, the values of the coefficients are chosen so as to maximize the signals internal to the modulator, but by taking care not to exceed the saturation threshold of the modulator. The use of a law f having weighting values f(k) greater than 1 then risks causing the saturation of the modulator. In this case, a law f will be preferred in which all the values are less than or equal to 1. If, on the other hand, the coefficients of the modulator are chosen such that the internal signals of the modulator always remain away from the saturation threshold, the law f can have values greater than 1, which makes it possible in particular to increase the signal-to-noise ratio.

Variation of the Law f:

Generally, the law f can have constant variation phases and/or increasing variation phases to satisfy the various constraints of the sigma-delta converter, particularly in terms of noise and/or of continuity or of periodicity (cyclical law) of the law f if the analogue and digital integrators are not reset between two successive phases of acquisition of a digital value of the signal (for example in the case of a sigma-delta converter used to digitize variable signals). To obtain the linearity gain sought, the law f however includes at least one decreasing variation phase during a phase of acquisition of a digital value of the input signal.

Moreover, it will be noted that a predetermined law should be understood to be a law that is defined in the design of the modulator or during a phase of configuration thereof. However, the law can possibly be adjusted dynamically according to predefined rules, during a phase of acquisition of a digital value of the input signal, for example in order to adapt the law to the characteristics of the signal being converted.

As a variant, several distinct predetermined laws can be used to weight the coefficients of the sigma-delta modulator. As an example, the coefficient $c_1$ can be multiplied by a first variable law f1(k), and the coefficient $c_2$ by a second variable law f2(k) distinct from the law f1. In this case, to observe the abovementioned rules of scaling of the different signals of the modulator, the coefficient $c_6$ is multiplied by the law f2, the coefficient $c_7$ is multiplied by the law f1 and by the law f2, and the coefficient $b_5$ is multiplied by the law f1 and by the law f2. At the digital filter, the input signal of the digital integrator of rank 2 $In_2$ can be multiplied by the law f1, and the input signal of the digital integrator of rank 3 $In_3$ is multiplied by the law f2.

In another example, the coefficient $c_2$ can be multiplied by a first variable law f1(k). In this case, to observe the scaling of the different signals of the modulator, the coefficients $c_6$ and $c_7$ are multiplied by the law f1(k). A second law f2(k) is applied to the feed coefficient a1. The coefficient b5 is weighted by f1(k)*f2(k). Finally, a third law f3(k) is applied to the coefficient b1 of the input signal Vin. At the digital filter, the input signal of the digital integrator of rank 1 $In_1$ can be multiplied by the inverse feedback weighting law f2(k+1) and the input signal of the digital integrator of rank 3 $In_3$ can be multiplied by the law f1(k+1). It will be noted that the scaling rules in this example are not applied at all points, in particular between the coefficients b1 and a1, modulated respectively by two distinct laws f2 and f3. Likewise, the application of the law f3 is not here applied to the digital filter. The weighting law of the input signal of the filter differs in this example from that of the modulator. Some weightings can therefore be applied only to one of the coefficients of the modulator, upstream of an integrator, without downstream rescaling and without being applied to the filter. In the abovementioned example, the law f3 can be different from zero over the first j cycles, then set to 0 from a cycle k (with 1<j<k<OSR). Thus, the quantization process can continue with a zero weighting of the input signal, without that reducing the gain in linearity. In effect, the proposed weighting process makes it possible to continue the quantization of the residue of the conversion of the input signal Vin, after having weighted Vin in a non-zero manner over j first cycles.

Such combinations of laws can in particular make it possible to relax the implementation constraints which could result from the use of a single weighting law at the input of a single analogue integrator of the modulator and of a single digital integrator of the digital filter.

The embodiments described in relation to FIGS. 5A, 5B, 6, 7 and 8 can be adapted to all the known architectures of sigma-delta converters of order p greater than or equal to 1.

Figure 9:
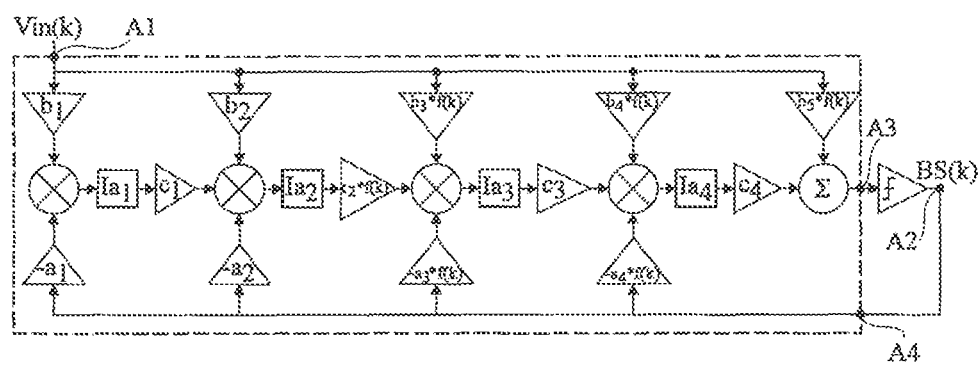
FIG. 9 illustrates, in block form, another example of an embodiment of a sigma-delta converter.

FIG. 9 illustrates an example of application to another type of sigma-delta converter architecture. In FIG. 9, only the sigma-delta modulator of the converter has been represented. The digital filter of the converter is for example identical or similar to the digital filter of FIG. 5B.

The sigma-delta modulator of FIG. 9 comprises elements in common with the sigma-delta modulator of FIG. 5A. Hereinbelow, only the differences between these two modulators will be detailed. The modulator of FIG. 9 differs from the modulator of FIG. 5A in particular in that, in the modulator of FIG. 9, the weighting coefficients $b_2$, $a_2$, $b_3$, $a_3$, $b_4$ and $a_4$ are not zero, and the coefficients $c_5$, $c_6$ and $c_7$ are zero.

In the example of FIG. 9, the weighting coefficients $c_2$, $b_3$, $a_3$, $b_4$, $a_4$ and $b_5$ are multiplied by a same predetermined variable law f.

As in the example of FIGS. 5A and 5B, there is observed, in certain OSR ranges, a significant gain in terms of linearity and a noise level substantially preserved in relation to the case where all the coefficients of the modulator would be constant.

Figure 10:
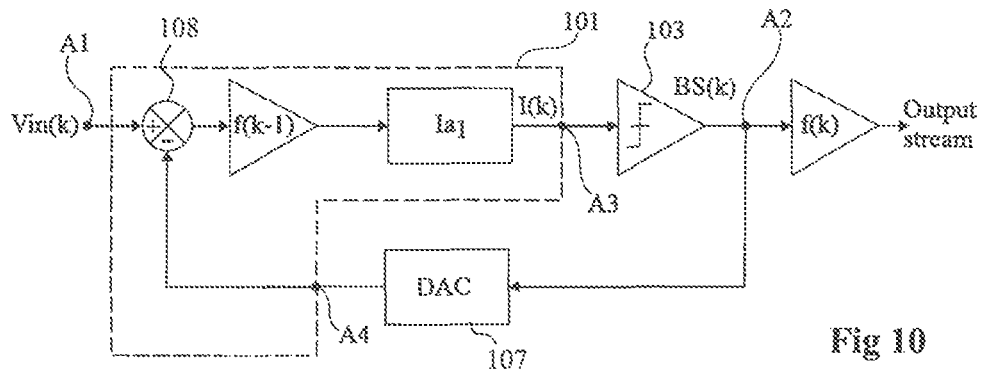
FIG. 10 illustrates, in block form, another example of an embodiment of a sigma-delta converter.

FIG. 10 illustrates, in block form, another example of an embodiment of a sigma-delta converter. The converter of FIG. 10 is a $1^{st}$ order converter, comprising a $1^{st}$ order sigma-delta modulator, and a $1^{st}$ order digital filter.

The sigma-delta modulator of FIG. 10 comprises an input terminal A1 intended to receive an analogue input signal Vin to be digitized, and an output terminal A2 intended to supply a series of binary samples BS representative of the signal Vin. The modulator of FIG. 10 comprises an analogue integration circuit 101 comprising a first input connected to the terminal A1 for application of the signal Vin, and an output A3 linked to the input of a 1-bit analogue-digital conversion circuit 103, for example a 1-bit comparator. The output of the converter 103 is connected to the output A2 of the modulator, and is also linked by a feedback loop to a second input A4 of the integration circuit 101. In the example represented, the feedback loop comprises a 1-bit digital-analogue converter 107 (DAC) whose input is connected to the terminal A2 and whose output is connected to the terminal A4. At each cycle k of duration $T_{OSR}$ of a phase of conversion of the input signal Vin to a digital value, with k being an integer ranging from 0 to OSR, the integration circuit 101 takes an analogue sample Vin(k) of the input signal, and the modulator supplies, at the output of the 1-bit analogue-digital converter 103, a binary sample BS(k) of the output signal. In the example of FIG. 10, the integration circuit 101 comprises a single analogue integrator $Ia_1$, for example a simple analogue summing circuit comprising an input and an output, this circuit being adapted, at each cycle, to increment the value of the output signal (or integrated signal) by the value of the signal applied at the input of the integrator. In the example of FIG. 10, the integrator $Ia_1$ receives on its input a signal equal to the difference between the input signal Vin(k) and the feedback signal applied to the terminal A4 (corresponding to the analogue value of the signal BS(k−1)), weighted by a variable coefficient f(k−1) according to a predetermined law f. The difference operation is symbolized by a subtractor 108. The output of the integrator $Ia_1$ is connected to the output terminal A3 of the circuit 101.

The digital filter of the sigma-delta converter of FIG. 10 comprises a digital integrator (not represented), for example a counter, whose input is linked to the output A2 of the modulator via a digital circuit for application of a variable weighting coefficient f(k) according to the law f. In this example, the variable law f is applied at the digital filter with an advance cycle in relation to the modulator.

It will be noted that the input datum of the digital filter is the binary output datum of the sigma-delta modulator, and that the resolution of the internal data of the digital filter depends on the OSR and on the resolution of the weighting law f. The resolution of the weighting law f in the digital filter is preferably greater than or equal to the resolution of the law f in the modulator.

The following equations formalize, for an example of sigma-delta converter of the type described in relation to FIG. 10, the improvement of the performance levels linked to the application of a variable weighting law in the modulator.

A decreasing exponential law f is considered here that is given by the equation $f(k) = q^k$, with $q \in ]0.5; 1]$. It is also considered that the dynamic range of the input signal Vin is limited and satisfies the relationship $|Vin| \le q - 0.5$. It is also considered that the output value BS(k) of the sigma-delta modulator can take the value 1 or −1 for $k \ge 1$, and is initialized at 0 for k=0. In this example, the digital-analogue converter 107 supplies, on the terminal A4, an analogue value equal to 0.5*BS(k−1).

For an OSR equal to m (with m being an integer greater than or equal to 1), the output I(m) of the analogue integrator can be written as follows:

$$I(m) = \sum_{k=0}^{m-1} q^k Vin(k) - \frac{1}{2}\sum_{k=0}^{m-1} q^k BS(k) \qquad (1)$$

with $$BS(k) = \text{sign}(I(m)) \qquad (2)$$

The sequence U(m) representing the difference between the accumulated energy originating from the continuous input signal Vin and the accumulated energy originating from the inverse feedback performed by the sigma-delta modulator is defined as follows. This sequence U(m) represents the difference between the energy introduced by the signal and its estimate.

$$U(m) = I(m) - \frac{1}{2}q^m BS(m) = \sum_{k=0}^{m-1} q^k Vin(k) - \frac{1}{2}\sum_{k=0}^{m} q^k BS(k) \qquad (3)$$

To show the advantage of the sigma-delta modulator of FIG. 10 compared to a conventional $1^{st}$ order sigma-delta modulator, it is demonstrated hereinbelow that the following assertion P(m) is valid for any $m \ge 1$:

$$P(m): |U(m)| \le \frac{1}{2}q^m \qquad (4)$$

It is first of all shown that for m=1, the assertion P is borne out.

For $0 \le Vin \le q-0.5$, BS(1)=1. There is then $-0.5q \le Vin-0.5q \le 0.5(q-1)$, and therefore $-0.5q \le U(1) \le 0.5q$. The same result is obtained for a negative input Vin. The assertion P (equation (4)) is therefore borne out for m=1.

It is also possible to show that, for any $m \ge 1$, if P(m) is borne out, then P(m+1) is borne out.

For $I(m+1) = U(m) + q^m Vin \ge 0$, BS(m+1)=1. There is then $0 \le U(m) + q^m Vin \le 0.5 q^m + q^m Vin$, i.e., $-0.5 q^{m+1} \le U(m) + q^m Vin - 0.5 q^{m+1} \le 0.5 q^m + q^m Vin - 0.5 q^{m+1}$, i.e. $-0.5 q^{m+1} \le U(m+1) \le q^m(0.5 + Vin - 0.5 q)$. Given that $0.5 + Vin - 0.5 q \le 0.5 q$, $-0.5 q^{m+1} \le U(m+1) \le 0.5 q^{m+1}$. Similarly, it can be shown that if $I(m+1) 32 U(m) + q^m Vin \le 0$, then P(m+1) is borne out if P(m) is borne out.

It can be deduced from the above that the assertion P (equation (4)) is valid for any $m \ge 1$.

The result thereof is that $$\left| Vin - \frac{1}{2}\frac{\sum_{k=0}^{m} q^k BS(k)}{\sum_{k=0}^{m-1} q^k} \right| \le \frac{1}{2}\frac{q^m}{\sum_{k=0}^{m-1} q^k} \qquad (5)$$

The estimated value $Vin_q$ of the signal Vin is then defined by the equation (6) below, with an estimation error $e_q$ defined by the equation (7).

$$Vin_q = \frac{1}{2}\frac{\sum_{k=0}^{m} q^k BS(k)}{\sum_{k=0}^{m-1} q^k} \qquad (6)$$

$$e_q = \frac{q^m}{\sum_{k=0}^{m-1} q^k} \qquad (7)$$

For q=1, which corresponds to a standard sigma-delta converter (without modulation of a coefficient by a variable law), the error $e_q$ has the value 1/m.

For $m \ge 1$, it can be shown that $$\frac{q^m}{\sum_{k=0}^{m-1} q^k} \le \frac{1}{m} \quad \left(\text{equivalent to } \frac{q^m(1-q)}{1-q^m} \le \frac{1}{m}\right) \qquad (8)$$

because: $q^m(m - mq + 1) \le 1 \qquad (9)$

In effect, the maximum of the term $q^m(m-mq+1)$ is reached when the derivative of this term (in relation to q) is cancelled, that is to say for q=1.

The result of the above is that, for a given OSR value m, the modulator of FIG. 1 converges more rapidly for q∈]0.5; 1[ than for q=1 (standard modulator, without weighting by a variable law).

Figure 11:
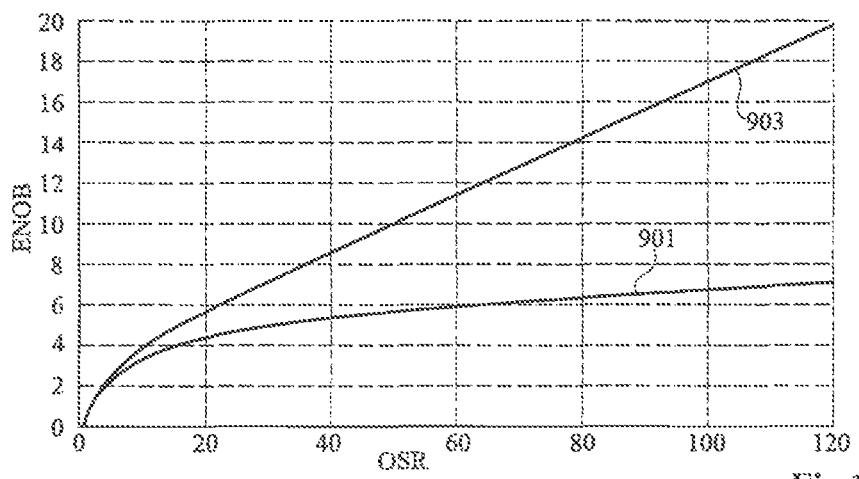
FIG. 11 is a diagram illustrating the behaviour of the sigma-delta converter of FIG. 10.

FIG. 11 is a diagram illustrating the trend, as a function of the OSR, of the theoretical effective number of bits ENOB defined by $$ENOB = \log_2\left((2q-1) / \left(\frac{q^m}{\sum_{k=0}^{m-1} q^k}\right)\right) \quad (10)$$

More particularly, FIG. 11 comprises a curve 901 illustrating the trend of the theoretical effective number of bits ENOB for q=1 (case of a standard converter), and a curve 903 illustrating the trend of the theoretical effective number of bits ENOB for q=1/1.1 (case of a converter with weighting of a coefficient of the modulator by a decreasing exponential law). It is observed in the diagram of FIG. 11 that, whatever the OSR considered, the theoretical effective number of bits ENOB is higher for q=1/1.1 than for q=1, and that the difference is all the higher when OSR is high. As an example, for an OSR equal to 80, a difference of almost 8 bits is observed between the case q=1/1.1 and the case q=1.

Figure 12:
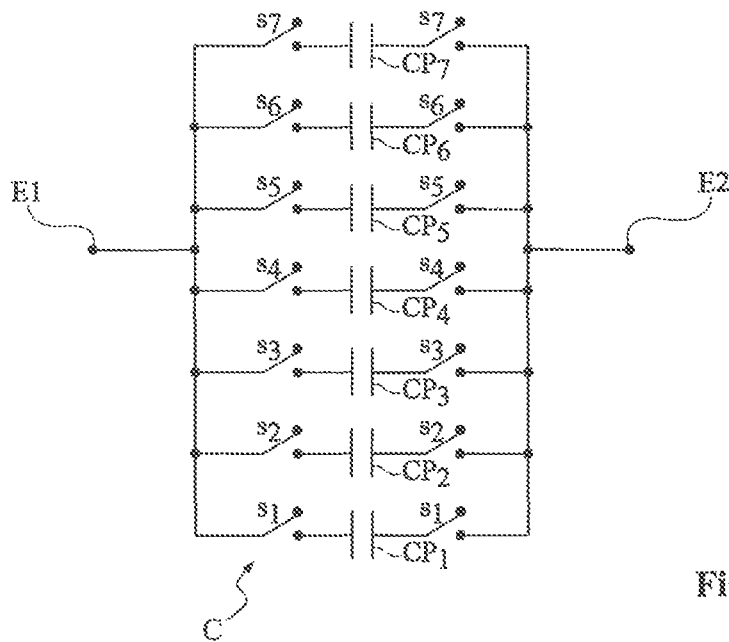
FIG. 12 is an electrical circuit diagram of an exemplary embodiment of a circuit making it possible to dynamically vary a weighting coefficient of a sigma-delta modulator.

FIG. 12 is an electrical circuit diagram of an exemplary embodiment of a circuit making it possible to dynamically vary a weighting coefficient of a sigma-delta modulator according to a variable law f.

In this example, it is considered that the OSR coefficients f(k) of the law f are quantized on a number n of bits (n=6 in the example represented). It is also considered that the weighting coefficient that is to be dynamically modulated is set by the capacitance of a capacitor C.

Instead of having a set capacitance value as in the modulator of the type described in relation to FIG. 2, the capacitor C is, in this example, a capacitor with variable capacitance that can be controlled digitally, performed using a table of switched capacitances.

More particularly, in the example of FIG. 12, the capacitor C is divided into n+1 capacitances $CP_1$ to $CP_{n+1}$. The values of the capacitances $CP_1$ to $CP_n$ are obtained by dichotomic division of the value of the capacitance $C_{base}$ corresponding to the base (unweighted) coefficient. Thus, the capacitances $CP_1$, $CP_2$, ... $CP_n$ have, respectively, the values $C_{base}/2$, $C_{base}/4$, ... $C_{base}/2n$. The capacitance $CP_{n+1}$ has, for its part, the same value as the capacitance $CP_n$. Thus, the sum of the values of the capacitances $CP_1$ to $CP_{n+1}$ is equal to $C_{base}$.

The variable capacitance capacitor C of FIG. 12 comprises, between conduction terminals E1 and E2, n+1 parallel branches each comprising one of the n+1 capacitances $CP_q$, with q being an integer ranging from 1 to n+1, and two switches $s_q$ controlled by a same control signal (or by control signals that are very slightly staggered, for example exhibiting a temporal offset less than $0.1*T_{OSR}$), linking the electrodes of the capacitance $CP_q$ respectively to the terminal E1 and to the terminal E2.

A control circuit not represented can be provided to control the switches $s_q$ so as to dynamically vary the capacitance of a capacitor C during a phase of analogue-digital conversion of the input signal of the sigma-delta converter.

To weight the coefficient concerned by a value f(k)=1, all the switches $s_q$ can be closed. The capacitance of the capacitor C is then equal to $C_{base}$.

For all the other values (less than 1 in this example) of the law f(k), the switches $s_{n+1}$ are open, and the digital value on n bits of the law f(k) is applied to the control signals of the switches $s_1$ to $s_n$, the most significant bit being applied to the switches $s_1$, and the least significant bit being applied to the switches $s_n$.

As an example, to produce a sigma-delta modulator of the type described in relation to FIG. 5A, it is possible to start from a circuit of the type described in relation to FIG. 2, in which the capacitances co2, Cs5, cff1 and cff2 are replaced by variable capacitors of the type described in relation to FIG. 12.

One advantage of the circuit of FIG. 12 is that the weighting law f(k) can easily be reconfigured, for example if the needs of the application change.

The embodiments described are not however limited to the exemplary circuit of FIG. 12 to dynamically vary the coefficients of a sigma-delta modulator according to a predetermined law. More generally, any other suitable circuit can be used, for example a circuit with variable capacitance with analogue or digital control.

Particular embodiments have been described. Miscellaneous variants and modifications will become apparent to a person skilled in the art.

In particular, only discrete implementations with switched capacitances, in which the analogue signal to be digitized is a voltage and is sampled on capacitances of the sigma-delta modulator (example of FIG. 2), have been considered here. The embodiments described are not limited to this particular case. As a variant, the proposed solution can be adapted to sigma-delta modulators with current mode analogue input. In this case, the weighting of the signals internal to the modulator by a variable law can for example be performed by modulating the integration times of the currents on capacitances. For continuous-time modulators, the weighting law will no longer be discrete (f(k)) but continuous (f(t)).

Moreover, it will be noted that the proposed solution can be adapted to sigma-delta modulators of MASH (Multi-Stage Noise Shaping) type, that is to say modulators of order p greater than 1 consisting of the series arrangement of several sigma-delta modulators of order less than p, each modulator of order less than p comprising, as in the modulators described above, an analogue integration circuit, a 1-bit analogue-digital converter, and a feedback loop that can comprise a digital-analogue converter and a subtractor. The principle of operation of the sigma-delta modulators of MASH type is for example described in the article "Sturdy MASH Δ-Σ modulator" by Maghari et al. (ELECTRONICS LETTERS 26 Oct. 2006 Vol. 42 No. 22). As in the examples described above, the signals to which the weighting law f(k) is applied are chosen such that at least one weighting by the law f(k) is performed upstream of an analogue integrator of the modulator and preferably such that the different signals added or subtracted in the modulator and/or in the digital filter of the converter are to the same scale.

It will also be noted that, in the examples described above, the analogue input signal is applied at the input of the analogue integration circuit 101 of the modulator, and the 1-bit analogue-digital converter 103 of the modulator compares an output signal of the circuit 101 to a constant reference signal. As a variant, the input signal and the reference signal can be reversed. In this case, the inventors have found that if the coefficients of the modulator are set, the output noise of the sigma-delta converter is relatively high. On the other hand, the application of a variable weighting law to coefficients of the modulator makes it possible to significantly improve the precision of the converter. One advantage of this variant embodiment is that the reference input of the comparator 103 is a high-impedance input. Thus, the application of the signal to be converted directly to the comparator makes it possible to avoid drawing power from the signal to be digitized.

Moreover, exemplary embodiments of sigma-delta modulators have been described above comprising one or more cascaded analogue integrators. The embodiments described are not limited to this particular case. More generally, in the embodiments described, the analogue integrators of the sigma-delta modulators can be replaced by other types of analogue filters.

Figure 13:
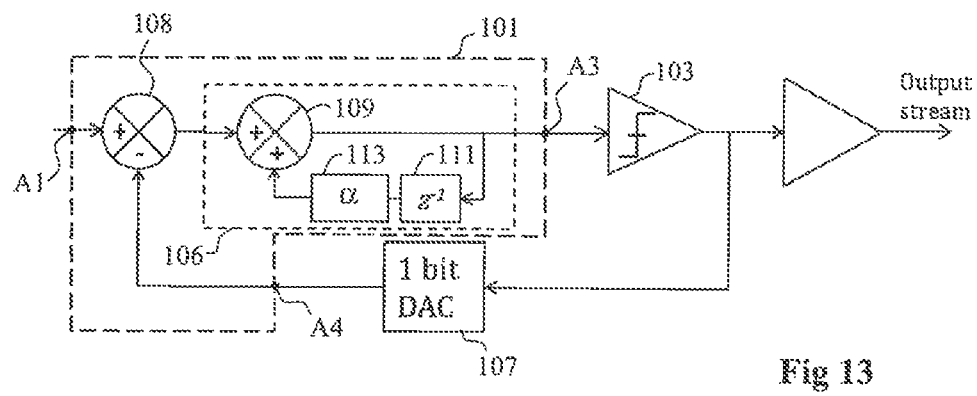
FIG. 13 illustrates, in block form, another example of an embodiment of a sigma-delta converter of order 1.

FIG. 13 illustrates, in block form, another example of an embodiment of a 1$^{st}$ order sigma-delta converter. In FIG. 13, only the sigma-delta modulator of the converter has been represented. There are, as in FIG. 10, the analogue integration circuit 101, the 1-bit analogue-digital conversion circuit 103 and the 1-bit digital-analogue converter 107 and the subtractor 108. Unlike FIG. 9, the analogue filter 106 of the analogue integration circuit 101 represented in FIG. 13 comprises a summer 109, a unitary gain delay operator 111, denoted $Z^{-1}$, and a multiplier 113 making it possible to multiply the output signal of the operator 111 by a factor $\alpha$. The summer 109 adds the analogue signal received at the cycle k and a signal internal to the analogue filter derived from the operator 111 multiplied by the coefficient $\alpha$. The output of the summer 109 supplies the input of the operator 111 and forms the output A3 of the integration circuit 101. Thus, the signal internal to the analogue filter derived from the operator 111 forms the output of the analogue filter at the cycle k−1. By choosing a value of the coefficient $\alpha$ strictly greater than 1, the contribution to the output value of the analogue filter at the point A3 of the analogue input signal of the summer 109 derived from the subtractor 108 at the cycle k is smaller than its contribution to the analogue filter at the preceding cycle k−1. For the contribution condition to be observed, it is sufficient for the coefficient $\alpha$ to be strictly greater than 1 during at least one cycle during the conversion phase. It is of course possible to provide a coefficient $\alpha$ strictly greater than 1 for several cycles, even for all the cycles of a conversion phase.

Figure 14:
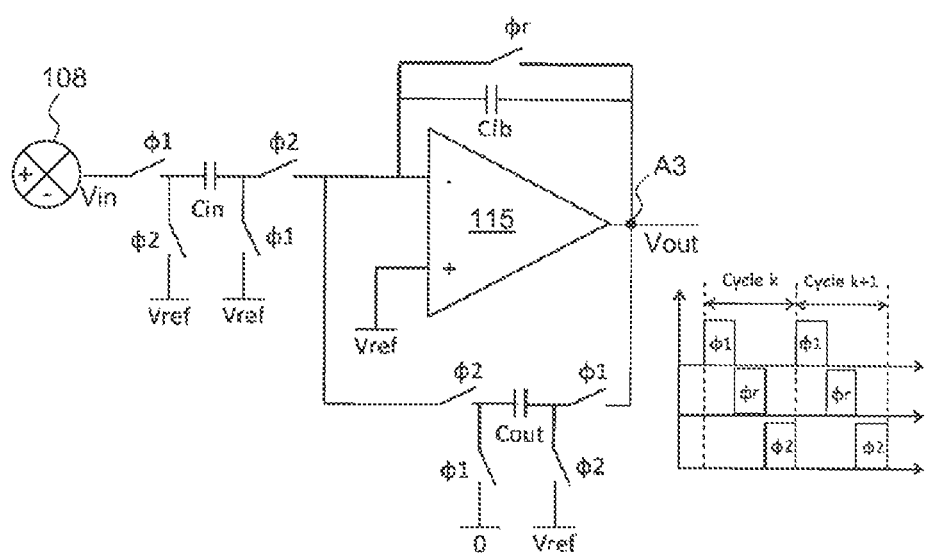
FIG. 14 illustrates an exemplary embodiment of an analogue filter that can be implemented in the exemplary embodiment of FIG. 13.

The functional blocks represented in FIG. 13 can be produced in many ways, one of which is explained in FIG. 14. It is of course possible to produce the summer, 109, the operator 111 and the multiplier 113 in other forms based on components available on the market and their ease of implementation.

In FIG. 14, the summer, 109, the operator 111 and the multiplier 113 are produced from an operational amplifier 115 receiving, on its inverting input, the internal signal derived from the subtractor 108 via a capacitance Cin. Switches $\Phi$1 and $\Phi$2 make it possible to connect the capacitance Cin either to the output of the summer 108, or to a reference voltage Vref or to the inverting input. The inverting input is connected to the output of the operational amplifier 115 via a capacitance Cfb which can be short-circuited by a switch $\Phi$r. The inverting input is also connected to the output of the operational amplifier 115 via a capacitance Cout which can be switched by switches also called $\Phi$1 and $\Phi$2. Although the switches switching the capacitances Cin and Cout are different, same designations are used for the switches switched simultaneously. A timing diagram is represented in FIG. 14 to show the sequencing per cycle of three switching phases of the switches $\Phi$1, $\Phi$2 and $\Phi$r. To simplify understanding, the three phases $\Phi$1 $\Phi$2 and $\Phi$r are referred to by the designation of the switches closed during each of the phases.

During the phase $\Phi$1, there are the following quantities of charges on the capacitances Cin and Cout:

$$Qcin=Cin*(Vref-Vin(k))$$

$$Qcout=Cout*(0-Vout(k-1)).$$

During the phase $\Phi$r, the integrator made up of the amplifier 115 with the capacitance Cfb is reset by short-circuiting Cfb. Its charge Qcfb becomes zero.

During the phase $\Phi$2, all of the charges Qcin and Qcout are transferred to the capacitance Cfb. Then:

$$Qcin+Qcout=Cfb*(Vref-Vout(k)).$$

By resolving this expression with Cin=Cfb=C, and by posing Cout=$\alpha$*C, the following is obtained:

$$Vout(k)=Vin(k)+\alpha*Vout(k-1).$$

The ratio between the values of the capacitances Cout on the one hand and Cfb and Cin on the other hand gives the value of the coefficient $\alpha$.

From the example of FIG. 10, the benefit of the invention has been shown above from the example of an exponential law decreasing as a function of the rank k of the cycle: $f(k)=q^k$. To obtain the same result in the variant described from FIG. 13, the coefficient $\alpha$ can be given a value equal to 1/q.

The weighting $\alpha$ of the integrator is constant; 1/q, but the contribution of the input signal of the integrator in the integrator decreases by following the law $f(k)=q^k$. Moreover, the weighting of the output of the digital filter can follow the law f(k) (or f(k+1)) given the theoretical offset of application between the modulator and the digital filter. Another decreasing law can also be chosen for the digital filter.

The variant embodiment described from FIGS. 13 and 14 presents the advantage of not necessarily introducing scale factor at the output of the integration circuit 101. There is nevertheless a risk of saturation of the integrator due to a gain greater than 1.

In the variant described using FIG. 10, at each cycle, the weighting of each input signal of the integrator Ia$_1$ is given by $q^k$, such that the contribution of the input signal to the value of the integrator follows the relationship:

$$\frac{q^k}{\sum_{i=1}^{k-1} q^i}$$

In the variant described using FIG. 13, at each cycle, the contribution of the input signal to the value of the integrator 106 follows the relationship:

$$\frac{1}{\sum_{i=1}^{k-1} \frac{1}{q^i}}$$

These two relationships are completely equivalent.

Another way of expressing the equivalence of the two weightings is to define, in the variant illustrated by FIG. 10, the weighting at the input of the integrator by $\beta_k$ (k variant from 1 to OSR) and the gain of the integrator of rank k in the variant illustrated by FIG. 13 by $\alpha_k$.

Then:

$$\beta_k = \prod_{i=1}^{k} \frac{1}{\alpha_i}$$

It is necessary to fulfil the condition $\beta_k < \beta_{k-1}$ (or at least one $\alpha_k > 1$ in the integrator) for at least one given rank k in order for the contribution of a signal at the input of the integrator to exhibit a decreasing phase during a conversion of OSR cycles.

One advantage of an exponential decrease at the input of the integrator (FIG. 10) is linked to the consumption. In effect, in an embodiment with switched capacitances, the consumption linked to the charge of capacitances of decreasing value makes it possible to reduce the dynamic consumption. Nevertheless, this attenuation of the gain can cause the temporal noise to be raised. However, in some imaging applications for example, the linearity of the digital value produced at the output of the converter is greater than the temporal noise on this digital value. In effect, on a series of images, the eye will tend to smooth or average the temporal noise and will thus be more sensitive to the linearity errors (if a population of digital output values is considered here that relates to several conversions of one and the same static analogue input value, the noise is relative to the standard deviation of the population and the linearity error is relative to the difference between the theoretical digital value expected and the average of the population). Thus, as has been demonstrated above, the proposed invention and in particular its variant explained from FIG. 10, despite everything reduces the linearity error.

With the variant proposed from FIG. 13 in which the gain of the integrator is multiplied by 1/q, there is a gain in linearity while affecting the noise less because the amplitude (or more specifically the envelope) of the signals is not attenuated at the input and at the output of the integrator.

The variant explained using FIG. 10 and the variant explained using FIG. 13 can be combined in order to avoid the risk of saturation at the integrator. This combination consists, for example, in applying a weighting law to the input signal of the integrator Ia1 for example of $f(k)=q^k$ type, with k varying from 1 to OSR, according to the variant of FIG. 10, and at least once and advantageously periodically every N cycles within the OSR cycles, in resetting the weighting law and by applying to the integrator a corresponding gain according to the variant of FIG. 13. The weighting law then follows the law q to the power (k−n*integer part of (k/n)) and every N cycles a gain $(1/q)^N$ is applied to the integrator.

Figure 15A:
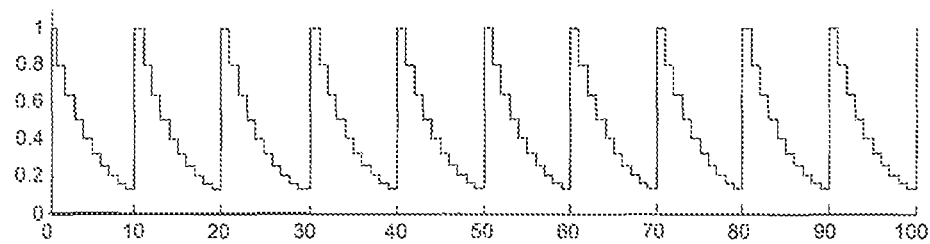
FIGS. 15a and 15b illustrate, in the form of a timing diagram, the trend, as a function of time, of coefficients applied to the modulator of the converter of FIG. 13.

FIG. 15a represents, in timing diagram form in which the time axis is expressed in number of cycles of trending of the weighting at the input of the integrator according to the variant of FIG. 10. In this example, the law f is of the form $f(k)=q^k$ with q=0.8. The total number of cycles OSR to produce a digital output value is 100 and the number N of cycles after which the weighting at the input of the integrator is reset is 10. At the first cycle of the conversion phase, the weighting is 0.8 and follows the relationship $0.8^k$ until the tenth cycle, then is reset to 1 at the eleventh cycle. This decrease followed by a reset is repeated every 10 cycles up to OSR=100.

Figure 15B:
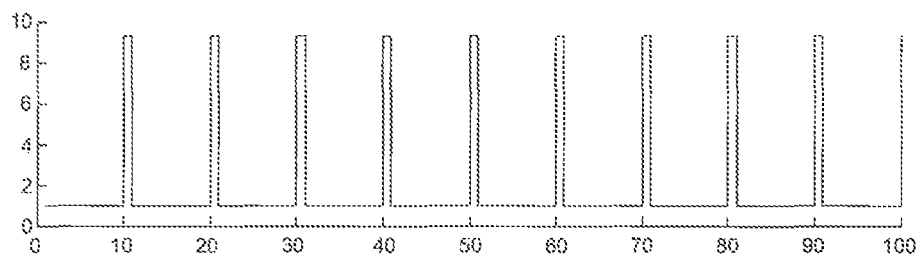

FIG. 15b represents, in timing diagram form with the same time axis, the weighting applied to the gain of the integrator according to the variant of FIG. 13. Every N cycles, 10 in the example represented, the gain α of the integrator (initially equal to 1) is multiplied by $(1/q)^N$, that is to say $(1/0.8)^{10} \approx 9.31$, then is reset to its initial value at the next cycle.

Thus, the property of a contribution of the input value of the integrator which follows the law f(k) is conserved. In this combination, the risk of saturation is reduced and the robustness to noise is increased because of the lesser attenuation affecting the input signal of the integrator.

Another combination of the two variants of FIGS. 10 and 13 consists in performing simultaneously, at least for a same rank k, a weighting at the integrator input and a gain in the integrator.

Figure 16:
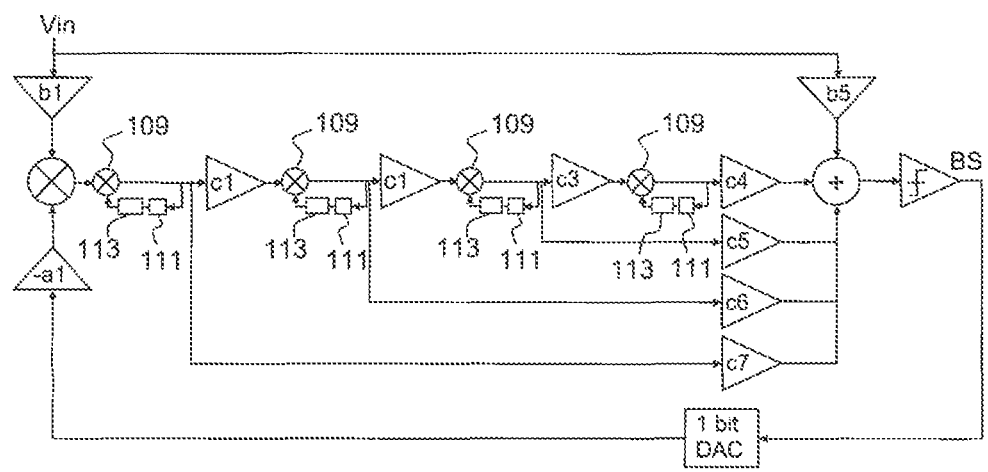
FIG. 16 illustrates, in block form, a generalization of the example of FIG. 13 to converters of order higher than 1.

Above, it has been seen with the aid of FIG. 5a that the variant of FIG. 10 can be generalized to converters of order greater than 1 comprising several cascaded analogue filters. The same applies for the variant presented using FIG. 13 which can be generalized to converters of order greater than 1. This generalization is presented in FIG. 16 in which each integrator Ia1 to Ia4 of FIG. 1a is replaced by a summer 109, an operator 111 and a multiplier 113. It is of course possible to replace only at least one of the integrators Ia1 to Ia4 of FIG. 1a by a summer 109, an operator 111 and a multiplier 113.

In the case where several multipliers 113 are present, the factor α of each can be different in order to adjust the output variation ranges of the analogue integrating filters. The digital filter is then advantageously adapted according to the different factors α.

It has been specified above that miscellaneous variant architectures of digital filters can be considered. In particular, the topology of the digital filter can be modified to approximate that of the sigma-delta modulator. In the case of a modulator with cascaded analogue filters, it is advantageous to produce the digital filter by means of elementary filters of the same types and cascaded in the same way. Filters of the same type should be understood for example to mean high-pass, low-pass, bandpass, integrating and other such filters, which will be analogue in the modulator and digital in the digital filter.

In the particular case of cascaded digital integrators, different elementary filters can be implemented in an equivalent manner. It is for example possible to provide two variants of elementary filter. In the first variant, a unitary gain integrator is preceded by a multiplier, like the modulator of FIG. 10. In the second variant, the elementary filter comprises a non-unitary gain integrator like the modulator of FIG. 13. The cascades of integrators according to the two variants are nevertheless completely equivalent and can both be implemented at the output of a modulator according to FIG. 10 or at the output of a modulator according to FIG. 13.

To prove this equivalence, the table below presents a cascade of two unitary gain integrators preceded by a multiplier of coefficient $q^k$. In this table, it is considered that the input of the filter is unitary:

| Rank k | Input of the integrator 1 | Output of the integrator 1 | Output of the integrator 2 |
|---|---|---|---|
| 1 | q | 0 | 0 |
| 2 | $q^2$ | q | 0 |
| 3 | $q^3$ | $q^2 + q$ | q |
| 4 | $q^4$ | $q^3 + q^2 + q$ | $q^2 + 2q$ |
| 5 | $q^5$ | $q^4 + q^3 + q^2 + q$ | $q^3 + 2q^2 + 3q$ |

The output value of the second integrator is equal to:

$$\Sigma_{i=1}^{k-2}((k-2)-i+1)q^i$$

The ratio between the output of the second integrator and the input of the first integrator for two ranks k of difference is equal to:

$$\frac{\sum_{i=1}^{k-2}((k-2)-i+1)q^i}{q^{k-2}}$$

The table below presents a cascade of two integrators with gain 1/q:

| Rank k | Input of the integrator 1 | Output of the integrator 1 | Output of the integrator 2 |
|---|---|---|---|
| 1 | 1 | 0 | 0 |
| 2 | 1 | 1 | 0 |
| 3 | 1 | $1 + q^{-1}$ | 1 |
| 4 | 1 | $1 + q^{-1} + q^{-2}$ | $1 + 2q^{-1}$ |
| 5 | 1 | $1 + q^{-1} + q^{-2} + q^{-3}$ | $1 + 2q^{-1} + 3q^{-2}$ |

The output of the integrator 2 and the ratio between the output of the second integrator and the input of the first integrator for two ranks k of difference are equal to:

$$\frac{\sum_{i=1}^{k-2}((k-2)-i+1)q^i}{q^{k-2}}$$

The two ratios are much the same which shows the equivalence of the two digital filter variants. This equivalence has been shown for a cascade of two filters. Obviously, the equivalence between the two variants is obtained no matter how many elementary filters are cascaded.

The invention claimed is:

1. A sigma-delta converter comprising:
a sigma-delta modulator suitable for supplying a series of binary samples representative of an analogue input signal to be digitized, a delivery of a binary sample of the series of binary samples being performed on completion of a cycle of operation of the modulator, a conversion phase comprising a number of cycles necessary to produce a digital converter output value,
the modulator comprising at least one analogue filter receiving an internal analogue signal derived from the analogue input signal, in which a first predetermined law defines that a contribution to the at least one analogue filter of the analogue signal internal to a given cycle is smaller than a contribution to the analogue filter of the analogue signal internal as a function of a rank of a cycle in the conversion phase, the rank of the cycle varying from 1 to the number of cycles, the first law specifying a contribution to the analogue filter to a preceding cycle.

2. The converter according to claim 1, wherein the at least one analogue filter is an integrator.

3. The converter according to claim 1, further comprising a digital filter suitable for processing the binary samples output from the modulator, the digital filter receiving an internal digital signal in which a contribution to the digital filter of the digital signal internal to a given cycle is smaller than a contribution to the digital filter of the digital signal internal to a preceding cycle, contributions to different cycles being governed by a second law predetermined as a function of the rank of the cycle.

4. The converter according to claim 3, wherein the analogue filter and the digital filter are of a same type.

5. The converter according to claim 3, wherein the first and second predetermined laws are identical.

6. The converter according to claim 1, wherein the sigma-delta modulator comprises an analogue integration circuit, a 1-bit analogue-digital converter, and a feedback loop, and wherein said at least one analogue signal internal to the modulator is a signal internal to the analogue integration circuit.

7. The converter according to claim 6, wherein the analogue integration circuit comprises several cascaded analogue filters.

8. The converter according to claim 6, wherein the 1-bit analogue-digital converter comprises a comparator, and in which:
the analogue input signal to be digitized is applied to an input node of the analogue integration circuit; and
a constant potential is applied to a node of application of a comparison threshold potential of the comparator.

9. The converter according to claim 6, wherein the 1-bit analogue-digital converter comprises a comparator, and in which:
the analogue input signal to be digitized is applied to a node of application of a comparison threshold potential of the comparator; and
a constant potential is applied to an input node of the analogue integration circuit.

10. The converter according to claim 1, wherein the first predetermined law is applied to one or more analogue signals internal to the modulator so that all of the analogue signals added or subtracted in the modulator are to a same scale with respect to the first law, such that the analogue signals can vary within one and a same rank of amplitude for a given rank of amplitude of the analogue input signal.

11. The converter according to claim 3, wherein the digital filter comprises at least one digital integrator, and wherein said at least one digital signal internal to the digital filter is an input signal of one of the at least one digital integrator.

12. The converter according to claim 3, wherein the digital filter comprises several cascaded digital integrators.

13. The converter according to claim 1, wherein the first law is an exponential law decreasing as a function of the rank of the cycle.

14. The converter according to claim 1, wherein the first law is a constant during a first part of the conversion phase, and decreases exponentially as a function of the rank of the cycle during a second part of the conversion phase.

15. The converter according to claim 14, wherein the first law is constant during a third part of the conversion phase.

16. The converter according to claim 1, wherein the analogue input signal is weighted by a coefficient at the input of the modulator and in which a coefficient is non-zero during a first part of the conversion phase, followed by a second part of the conversion phase during which the coefficient is zero.

17. The converter according to claim 1, in which a first law is modified dynamically according to predetermined rules during the conversion phase.

18. The converter according to claim 4, wherein the first law is applied with a phase-shift in terms of number of cycles at the sigma-delta modulator and at the digital filter.

19. The converter according to claim 1, wherein the sigma-delta modulator comprises a plurality of cascaded analogue filters each receiving an internal analogue signal from the analogue input signal, wherein for each of the analogue filters, first predetermined laws define a contribution to the analogue filter of the internal analogue signal as a function of a rank of the cycle in the conversion phase, the first laws specifying that the contribution to the analogue filter at a given cycle is lower than a contribution to the analogue filter of the internal analogue signal in a previous cycle and wherein at least two of the first laws are distinct.

20. The converter according to claim 1, wherein at the modulator, a first variable law is applied by varying a variable capacitance during the conversion phase.

21. The converter according to claim 20, wherein said variable capacitance comprises a plurality of switchable capacitances linked in parallel, values of which correspond respectively to values obtained by dichotomy from a base capacitance value, a sum of the values of the switchable capacitances being equal to a value of the base capacitance.

22. The converter according to claim 1, comprising, at the input of the filter, a weighting device for the internal analogue signal received by the analogue filter applying a variable weighting coefficient βk, a function of the rank k of the cycle, and in which, during the conversion phase, at least two distinct coefficients βk−1 and βk are applied, respectively, for two successive cycles of rank k−1 and k, and in which βk−1 >βk.

23. The converter according to claim 22, wherein the variable weighting coefficient βk decreases with the rank k of the cycle.

24. The converter according to claim 2, wherein said at least one analogue integrating filter is equivalent to a theoretical circuit comprising a summer between a value of an analogue signal received at the cycle k and an internal signal of the filter corresponding to a multiplication by a coefficient α of the output signal of the analogue filter obtained at the cycle k−1, and in which, during the conversion phase, at least one value of the coefficient α strictly greater than 1 is applied for at least one cycle.

25. The converter according to claim 24, wherein the coefficient α increases with the rank k of the cycle.

26. The converter according to claim 22, configured so that, during the conversion phase, the following sequence of operations is applied at least once:
  for N cycles, N being greater than 1 and less than the number of cycles necessary to produce a digital output value from the converter, after an initial cycle, a decreasingly-variable weighting coefficient βk is applied to the internal analogue signal,
  for M subsequent cycles, M being greater than or equal to 1 and less than the number of cycles such that M+N is less than or equal to the number of cycles, the coefficient α of the analogue filter is strictly greater than 1.

27. The converter according to claim 26, wherein M is equal to 1 and wherein the coefficient α of the analogue filter takes a value greater than or equal to an inverse of the weighting coefficient βN applied at the cycle N, such that the output signal of the analogue filter once again has an amplitude of variation corresponding to the amplitude of variation at the initial cycle and the coefficient α is reset at the end of the N+1 cycle to revert to its value at the initial cycle.

28. A converter according to claim 1 wherein in a first cycle of the conversion phase, the first law is (re)initialized to an initial value.

* * * * *